United States Patent [19]
Park et al.

[11] Patent Number: 5,998,910
[45] Date of Patent: *Dec. 7, 1999

[54] RELAXOR FERROELECTRIC SINGLE CRYSTALS FOR ULTRASOUND TRANSDUCERS

[75] Inventors: Seung-Eek Park, State College; Thomas R. Shrout; Patrick D. Lopath, both of Port Matilda, all of Pa.

[73] Assignee: The Penn State Research Foundation, University Park, Pa.

[ * ] Notice: This patent is subject to a terminal disclaimer.

[21] Appl. No.: 09/013,746

[22] Filed: Jan. 27, 1998

Related U.S. Application Data

[63] Continuation-in-part of application No. 08/789,579, Jan. 28, 1997, Pat. No. 5,804,907
[60] Provisional application No. 60/039,611, Mar. 12, 1997.

[51] Int. Cl.⁶ .......................... H01L 41/04; C04B 35/00
[52] U.S. Cl. .................................. 310/358; 252/62.9 PZ
[58] Field of Search ...................... 310/358; 252/62.9 PZ

[56] References Cited

U.S. PATENT DOCUMENTS

| | | | |
|---|---|---|---|
| 4,109,359 | 8/1978 | Cross et al. | 29/25.35 |
| 4,313,839 | 2/1982 | Fesenko et al. | 252/69 PZ |
| 5,295,487 | 3/1994 | Saitoh et al. | 128/662.03 |
| 5,345,139 | 9/1994 | Gururaja et al. | 310/358 |
| 5,402,791 | 4/1995 | Saitoh et al. | 128/662.03 |
| 5,790,156 | 8/1998 | Mutton et al. | 347/71 |
| 5,804,907 | 9/1998 | Park et al. | 310/358 |

OTHER PUBLICATIONS

Saitoh et al., Single Element Ultrasonic Probe using PZN–PT Single Crystal, Proceedings of SPIE, Medical Imaging, 27,28 Feb. 1997, pp. 22+.
Gururaja, T., Piezoelectrics for Medical Ultrasonic Imaging, Am Cer. Soc Bull., V73, No.5, pp. 50–55, May 1994.
Smith, W. A., New Opportunities in Ultrasonic Transducers . . . , 1992 SPIE Int'l Symposium, 21–22 Jul. 1992, pp. 1–23.
Hagen–Ansert, S. L., Diagnostic Ultrasonography, C. V. Mosby Co. pp. 1–91, (1989).

Primary Examiner—Nestor Ramirez
Assistant Examiner—Peter Medley
Attorney, Agent, or Firm—Thomas J. Monahan

[57] ABSTRACT

<001>oriented crystals of lead zinc niobate—lead titanate solid solution (0 to 5 mole % lead titanate) have high electromechanical coupling>85% and exhibit electric field induced phase transition at electric field levels>10×Ec (where Ec is the coercive field), resulting in increased transducer driving voltages, decreased fabrication degradation, and high sensitivity/large bandwidth transducer characteristics due to high electromechanical couplings, up to 92%. <001>oriented crystals of lead magnesium niobate—lead titanate solid solution (20 to 50 mole % lead titanate) also exhibit high electromechanical couplings>85% and up to 94%, and thereby can be formed into transducers which exhibit both high sensitivity and large bandwidth.

7 Claims, 26 Drawing Sheets

2-2 COMPOSITE TRANSDUCER 1-3 COMPOSITE TRANSDUCER

RELAXOR FERROELECTRIC SINGLE CRYSTALS FOR ULTRASOUND TRANSDUCERS

This Application is a Continuation in Part of U.S. patent application Ser. No. 08/789,579, filed Jan. 28, 1997, now U.S. Pat. No. 5,804,907 and further claims priority from provisional application Ser. No. 60/039,611, filed Mar. 12, 1997.

FIELD OF THE INVENTION

This invention relates to transducers which employ ferroelectrics and, more particularly, to an electromechanical transducer that is constructed using single crystals of lead zinc niobate—lead titanate or lead magnesium niobate—lead titanate solid solutions. The compositions exhibit increased phase transition field values, allowing increased transducer driving voltages, decreased fabrication degradation and high electromechanical couplings, >85% and up to a maximum of 94%.

BACKGROUND OF THE INVENTION

Piezoelectric Transducers

Piezoelectric ceramics are currently the material of choice for ultrasonic transducer applications offering relatively high coupling (kij), a wide range of dielectric constants (K), and low dielectric loss. These merits translate into transducer performance in the form of relatively high sensitivity, broad bandwidth, impedance matching and minimal thermal heating.

$Pb(Zr_{l-x},Ti_x)O_3$ (PZT) ceramics have been a mainstay for high performance transducer applications. Compositionally, PZT ceramics lie near the morphotropic phase boundary (MPB) between the tetragonal and rhombohedral phases. MPB compositions have anomalously high dielectric and piezoelectric properties as a result of enhanced polarizability arising from coupling between two equivalent energy states, i.e. the tetragonal and rhombohedral phases, allowing optimum domain reorientation during the poling process. Further modifications, using acceptor and donor dopants, give a wide range of piezoelectric compositions.

Alternative MPB systems can be found in relaxor-based ferroelectrics and their solid solutions with $PbTiO_3$ (PT). Lead based relaxor materials are complex perovskites with the general formula $Pb(B_1B_2)O_3$, ($B_1=Mg^{2+}$, $Zn^{2+}$, $Ni^{2+}$, $Sc^{3+}$ ..., $B_2=Nb^{5+}$, $Ta^{5+}$, $W^{6+}$...). Characteristic of relaxors is a broad and frequency dispersive dielectric maxima. Some relaxor-PT compositions such as modified $Pb(Sc_{1/2}Nb_{1/2})O_3$ -$PbTiO_3$ (PSN-PT) seem to possess superior dielectric and piezoelectric properties compared to that of PZT ceramics. However, if analyzed with respect to the ferroelectric transition temperature Tc (the temperature at which the material transforms from the prototypical non-ferroelectric to ferroelectric phase being associated with a spontaneous polarization and large dielectric anomaly), no one type of ceramic offers significant advantages in overall transducer performance.

Enhanced piezoelectric activity of MPB-based ceramics by compositionally adjusting the Curie temperature (Tc) downward relative to room temperature, comes with the expense of more temperature dependent properties and less polarization stability, i.e. aging and loss of piezoelectric activity.

Though relaxor-PT ceramics do not offer enhanced dielectric and piezoelectric properties comparable to PZT ceramics of similar $T_c$'s, it is the single crystal form of relaxor-PT ceramics that exhibits ultrahigh piezoelectric properties not currently available with piezoelectric MPB ceramics. This key distinction was first realized by Yonezawa et al. (*Journal of Japanese Society of Powder Metallurgy*, Vol 16, pp 253–258, 1969) and later by Kuwata et al. (*Ferroelectrics*, Vol 37, pp 579–582, 1981) for MPB compositions of $Pb(Zn_{1/3}Nb_{2/3})O_3$ -$PbTiO_3$ (PZN-PT) systems with $k_{33}$ values ranging 80 to 90%, followed by crystal growth and evaluation of $Pb(Mg_{1/3}Nb_{2/3})O_3$ -$PbTiO_3$ (PMN-PT).

Although high coupling and piezoelectric properties of the PZN-PT system, first reported in 1969 and later in the PMN-PT system (1989), have been known for several years, their potential for high performance biomedical ultrasound transducers and related devices has only been recognized recently. Serious efforts on the development of $Pb(B_1B_2)O_3$-PT crystals for high performance transducers is disclosed in U.S. Pat. Nos. 5,402,791 and 5,295,487 to Saitoh et al. Therein are disclosed relaxor based ferroelectric single crystals of lead zinc niobate—lead titanate $(Pb(Zn_{1/3}Nb_{2/3})_{l-x}Ti_xO_3)$ and lead magnesium niobate—lead titanate $(Pb(Mg_{1/3}Nb_{2/3})_{l-x}Ti_xO_3$ ) solid solutions, where 0.05<x<0.2 and 0.05<y<0.2, respectively. It should be noted that the range 0.05<y<0.2 for $Pb(Mg_{1/3}Nb_{2/3})_{l-y}Ti_yO_3$ solid solutions described by Saitoh et al. includes the non piezoelectric relaxor (microdomain) region (0.05<y<0.15) at room temperature. For 0.15<y<0.20, according to this invention, crystals of $Pb(Mg_{1/3}Nb_{2/3})_{l-y}Ti_yO_3$ solid solutions exhibit longitudinal coupling<80%, only comparable to MPB ceramics.

When optimum crystallographic cuts, in this case pseudocubic <001>, are utilized for rhombohedral crystals, an electric field induced phase transformation from rhombohedral to tetragonal phase can occur under dc bias, because the polar axis in the rhombohedral phase is <111>. The phase transition field is strongly dependent upon composition, i.e., the closer to MPB, the lower the transition electric field level because two crystallographic states (rhombohedral and tetragonal) energetically become closer to each other and finally coexist at room temperature when the composition lies on a MPB (0.09<x<1.0 and 0.35<y<0.40, for $Pb(Zn_{1/3}Nb_{2/3})_{l-x}Ti_xO_3$ and $Pb(Mg_{1/3}Nb_{2/3})_{l-y}Ti_yO_3$, respectively).

The rhombohedral-tetragonal phase transition results in discontinuous changes in piezoelectric properties and dimensions. This dimensional change can affect transducer performance during fabrication processes, such as mechanical clamping during poling. Transducer poling normally includes field cooling (cooling under dc-bias from the temperatures above Tc).

FIG. 3 shows a plot of dielectric constant vs. temperature for $Pb(Zn_{1/3}Nb_{2/3})_{0.92}Ti_{0.08}O_3$, exhibiting transitions from rhombohedral to tetragonal (100° C.) and from tetragonal to cubic (160° C.). Apart from composition, the phase transition field decreases with increasing temperature. Therefore, increasing temperature under dc bias causes the rhombohedral phase to readily transform into the tetragonal phase.

It should be noted that transducers are attached to multiple quarter wave length matching layers and/or take the form of a low impedance composite comprised of piezoelectric elements with intermediate passive polymer layers, in order to couple acoustic energy and decouple lateral modes. Therefore, successive cooling under bias will cause the crystals to transform back to a rhombohedral phase after the passive polymer becomes significantly rigid at low temperature, resulting in elastically clamped crystals, leading to internal stresses and mechanical failure. Also, stability of rhombohedral phase becomes an issue as the transducer is driven at increased frequencies. To increase driving frequency and thereby obtain enhanced sensitivity, the transducer must be thinner, resulting in an increased electric field at a same driving voltage. Therefore, to avoid a phase transformation with a <001> rhombohedral crystal, the driving voltage must be limited. To apply higher voltages for pulse generation, the composition of a rhombohedral crystal should be located appropriately away from the MPB.

In summary, the problems exhibited by compositions of relaxor based single crystals are:

1) Lead magnesium niobate—lead titanate $(Pb(Mg_{1/3}Nb_{2/3})_{l-y}Ti_yO_3)$ is not piezoelectric at room temperature when $0.05<y<0.15$ and does not exhibit piezoelectric properties superior to conventional MPB ceramics when $0.15<y<0.20$.

2) For compositions close to MPB for rhombohedral lead zinc niobate—lead titanate $(Pb(Zn_{1/3}Nb_{2/3})_{l-x}Ti_xO_3)$, and lead magnesium niobate—lead titanate $(Pb(Mg_{1/3}Nb_{2/3})_{l-x}Ti_xO_3)$, where $0.05<x<0.09$ and $0.33<y<0.40$, the rhombohedral-tetragonal phase transformation occurs at relatively low fields.

Piezoelectric Actuators

Electromechanical actuators constructed from piezoelectric or electrostrictive ceramics are used in applications requiring high generative force, high frequency operation, accurate displacement, quick response time, or small device sizes. However, low field induced strain and poor reliability limit the usage of such ceramics for actuator applications.

Electric field induced strain is the most important parameter for actuators. This is demonstrated by the strain energy density which is a measure of the energy per unit mass an actuator can deliver, $$e_{max}=1/\rho \bullet (\tfrac{1}{2}\bullet E(\epsilon_{max})^2)$$

where: $e_{max}$ is the strain energy density E is the actuator's elastic modulus, $\epsilon_{max}$ is the maximum field induced strain, and $\rho$ is the actuator's density. In designing an actuator, the maximum strain energy density should be as high as possible. In electroactive ceramics, density and elastic modulus vary little from material to material. Therefore, level of strain and maximum strain achievable with a reasonable electric field (<50 kV/cm) dominates the energy density parameter.

Strain for a given electric field is determined from a material's piezoelectric coefficient ($d_{33}$). Soft lead-zirconate-titanates (PZT's) and perovskite relaxor-PT(Pb$((B_1,B_2)O_3$-PbTiO$_3$, (where $B_1=Mg^{+2}$, $Zn^{+2}$, $Ni^{+2}$, $Sc^{+3}$, ... and $B_2=Nb^{+5}$, $Ta^{+5}$, $W^{+6}$, ... ) based morphotropic phase boundary (MPB) ceramics offer piezoelectric coefficients~600 to 700 pC/N. However the best available actuators offer a maximum strain of not more than 0.15%. This limitation originates from the material's breakdown strength and polarization saturation.

Soft PZT's and relaxor-PbTiO$_3$ based ceramics are compositionally engineered to have morphotrophic phase boundary (MPB) composition and further engineered to have a decreased paraelectric-ferroelectric transition temperature (Tc), resulting in high piezoelectric coefficients. However, this increased piezoelectric activity comes with the expense of large hysteresis, ascribed to electric field induced domain motion. This results in poor positioning accuracy and large heat generation. Heat generation combined with decreased temperature usage range, also results in poor temperature stability of piezoelectric properties. This limits the driving frequency, prohibiting the usage of these high piezoelectric coefficient ceramics for high frequency driving applications.

Strain can be hysteresis minimized with hard piezoelectric ceramics, which exhibit decreased piezoelectric coefficient ($d_{33}$). A hard piezoelectric, such as PZT-4, exhibits piezoelectric coefficients of ~200 to 300 pC/N.

Another category of ceramic materials used in commercial actuators is electrostrictors. Electrostriction strain is proportional to the square of an applied electric field. A few materials such as lead magnesium niobate (PMN) or lead magnesium niobate—lead titanate (PMN-PT) solid solution ceramics with low lead titanate (PT) content exhibit a significant strain (>0.1%) with virtually no hysteresis.

In summary, the problems of commercially available piezoelectric and electrostrictive ceramics are:

1) Low total strain (<0.15%).
2) Low strain energy density due to low piezoelectric coefficient ($d_{33}$) <700 pC/N and electrical breakdown strength.
3) Significant hysteresis which leads to substantial heat generation and poor positioning accuracy.

To achieve strains>0.15%, electroactive materials should possess high piezoelectric coefficients ($d_{33}$>1000 pC/N) and high breakdown strength.

In the main, the prior art electroactive materials described above are based upon multicrystalline structures. Saitoh et al. in U.S. Pat. Nos. 5,295,487 and 5,402,791 describe a range of piezoelectric single crystal materials which exhibit large electromechanical coupling coefficients and teach their use as ultrasound transducers. One set of materials taught by Saitoh et al. is based upon single crystals in the form of solid solutions of zinc lead niobate—lead titanate. Another set of single crystals is given by the formula $$Pb\{(M1_{1/3}Nb_{(2/3)-(2z/3)}Ta_{2z/3})_{l-x-y}Ti_xM2_y\}O_3$$

where M1 represents one of metals Zn, Ni and Mg, and M2 represents one of Pt, Fe, Bi, Rh and Ir, and x, y and z are defined as $0.05<x<0.2$, $0.00001<y<0.01$ and $0<z<0.1$, respectively.

There is no teaching by Saitoh et al. that only a certain subset of their materials will exhibit a high strain factor (it being known to those skilled in the art that high coupling coefficients do not necessarily equate to high strain factors). As will be apparent from the description of the invention below, Applicants have discovered that a subset of the materials of Saitoh et al. exhibit large strains so long as an electric field is applied thereto generally along the 001 crystalline axis.

SUMMARY OF THE INVENTION

<001 > oriented crystals of lead zinc niobate—lead titanate solid solution (0 to 5 mole % lead titanate) have high electromechanical coupling>85% and exhibit electric field induced phase transitions at electric field levels>10×Ec (where Ec is the coercive field), resulting in increased transducer driving voltages, decreased fabrication degradation, and high sensitivity/large bandwidth transducer characteristics due to high electromechanical couplings, up to 92%. <001> oriented crystals of lead magnesium niobate—lead titanate solid solution (20 to 50 mole % lead titanate) also exhibit high electromechanical couplings>85% and up to 94%, and thereby can be formed into transducers which exhibit both high sensitivity and large bandwidth.

DETAILED DESCRIPTION OF THE PREFERRED EMBODIMENTS OF THE INVENTION

Piezoelectric Transducers

Figure 1A:
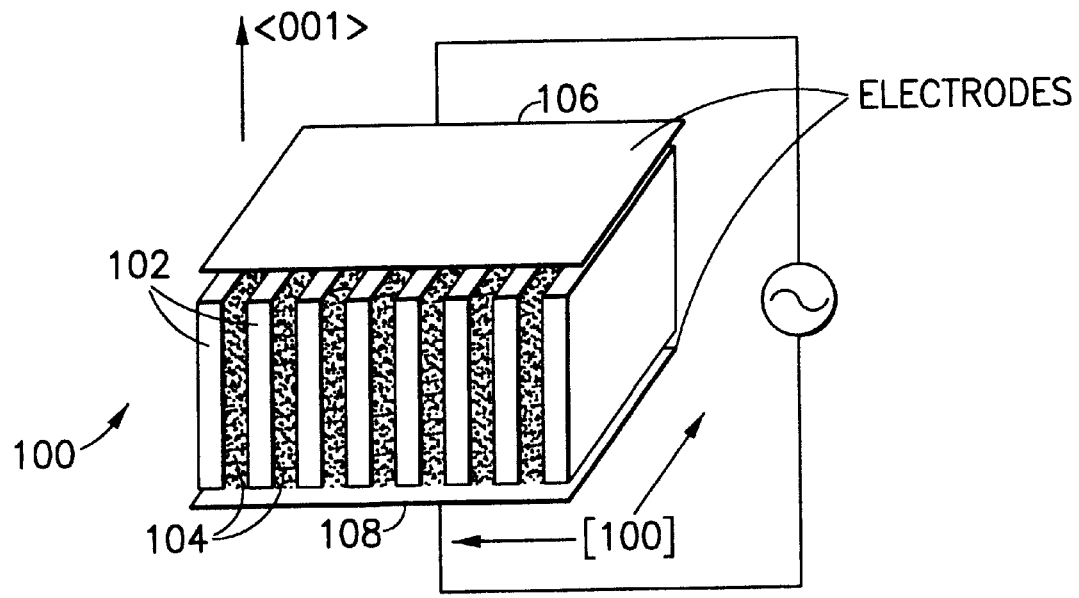
FIGS. 1a and 1b show ultrasound transducers, in accordance with the invention, comprising single crystal piezoelectric elements and intervening polymers.

This invention establishes structural property relationships, optimum compositions and crystallographic orientations for single crystals of lead zinc niobate—lead titanate $(Pb(Zn_{1/3}Nb_{2/3})_{l-x}Ti_xO_3)$ and lead magnesium niobate—lead titanate $(Pb(Mg_{1/3}Nb_{2/3})_{l-y}Ti_yO_3)$ solid solutions, which obtain ultrahigh electromechanical coupling and avoid induced phase transitions during transducer fabrication and driving. Based on the commonalties inherent to relaxor-PT systems, this invention considers two representative systems of lead zinc niobate—lead titanate $(Pb(Zn_{1/3}Nb_{2/3})_{l-x}Ti_xO_3)$ and lead magnesium niobate—lead titanate $(Pb(Mg_{1/3}Nb_{2/3})_{l-y}Ti_yO_3)$. Though lead magnesium niobate—lead titanate $(Pb(Mg_{1/3}Nb_{2/3})_{l-y}Ti_yO_3)$ crystals exhibit piezoelectric properties comparable with lead zinc niobate—lead titanate $(Pb(Zn_{1/3}Nb_{2/3})_{l-x}Ti_xO_3)$, more focus is given to the lead zinc niobate—lead titanate $(Pb(Zn_{1/3}Nb_{2/3})_{l-x}Ti_xO_3)$ system, owing to its relatively lower PT content for MPB. This allows more uniform crystal growth of such solid solution materials.

The crystals were fabricated as follows. High purity (>99.9%) powders of $Pb_3O_4$, ZnO, $MgCO_3$, $Nb_2O_5$ and $TiO_2$ were used as starting materials. Raw powders were weighed in desired molar ratios with excess $Pb_3O_4$ as a flux. The powder was dry mixed for a desired period of time using a tumbling mill. Mixed powder was loaded into a platinum crucible, which was then placed in an alumina crucible sealed with an alumina lid and alumina cement to minimize PbO volatilization. The crucible and powder were then placed in a tube furnace and held at an appropriate soak temperature above the melting temperature, followed by slow cooling. The crucible was then furnace-cooled to room temperature. Hot $HNO_3$ was used to separate the crystals from of the rest of the melt.

The crystals of lead zinc niobate—lead titanate and lead magnesium niobate—lead titanate solid solutions can similarly be fabricated using, i.e., the top seeded solution growth method (TSSG), the submerged seeded solution growth method, Kyropoulous method, the hydrothermal method, the Bridgman method, and the solid state growth technique (exaggerated grain growth), in addition to the flux method described above. Other crystal forms can be used. For example, material bodies comprising a textured structure or epitaxially grown films also show superior behavior. Further, the crystals can contain certain amounts of impurities from chemicals and crucibles, i.e. Pt, Ir, Rh, Fe, and Bi.

The piezoelectric properties were measured as follows. For longitudinal coupling ($k_{33}$) determinations, bar shape samples with lengths ranging from 3 mm to 5 mm were used. The piezoelectric coefficient (k33) was calculated based on IEEE standards. Individual crystals were oriented along their pseudocubic axes <111> and <001>, using a Laue back reflection camera. For electrical characterization, samples were prepared by polishing with silicon carbide and alumina polishing powders to achieve flat and parallel surfaces, onto which gold electrodes were sputtered. High-field measurements, including polarization and strain hysteresis, were made using a modified Sawyer-Tower circuit and linear variable differential transducer (LVDT), driven by a lock-in amplifier (Stanford Research Systems, Model SR830). Plate shaped samples with thicknesses ranging from 0.2 mm to 0.5 mm were used. The voltage was supplied using a Trek 609C-6 high voltage DC amplifier. Through use of the LVDT sensor, sample strain was measured when a field was applied. Electric fields as high as ~140 kV/cm could be applied using an amplified unipolar waveform at 0.2 Hz. During testing the samples were submerged in Fluorinert (FC-40, 3M, St. Paul, Minn.), an insulating liquid, to prevent arcing.

Piezoelectric single crystals according to the present invention are expressed by formulae 1–4 below:

$$Pb(Zn_{1/3}Nb_{2/3})_{1-x}Ti_xO_3 \quad (1)$$

where: x is defined as 0 <x<0.05. With these compositions, crystals have a rhombohedral structure and crystals oriented along pseudocubic <001> direction exhibit longitudinal couplings >85%. If x>0.05, <001> oriented rhombohedral $Pb(Zn_{1/3}Nb_{2/3})_{1-x}Ti_xO_3$ crystals transform into a tetragonal phase at electric fields lower than a 10× coercive field (Ec), limiting transducer driving voltage and increasing fabrication degradation.

$$Pb(Mg_{1/3}Nb_{2/3})_{1-y}Ti_yO_3 \quad (2)$$

where: y is defined as 0.20<y<0.50. With these compositions, crystals oriented along the pseudocubic <001> direction exhibit longitudinal coupling >80%. If 0<y<0.15, $Pb(Mg_{1/3}Nb_{2/3})_{1-y}Ti_yO_3$ crystals are not piezoelectric without a dc-bias at room temperature. If 0.15<y<0.2, $Pb(Mg_{1/3}Nb_{2/3})_{1-y}Ti_yO_3$ crystals exhibits longitudinal couplings lower than 80%.

$$Pb(Mg_{1/3}Nb_{2/3})_{1-y}Ti_yO_3 \quad (3)$$

where: y is defined as 0.20<y<0.35. With these compositions, crystals have rhombohedral structure and crystals oriented along pseudocubic <001> direction exhibit longitudinal couplings >80%.

$$Pb(Mg_{1/3}Nb_{2/3})_{1-y}Ti_yO_3 \quad (4)$$

where: y is defined as 0.35<y<0.50. With these compositions, crystals have MPB or tetragonal structure and crystals oriented along pseudocubic <001> direction exhibit longitudinal couplings >85%, comparable to those observed with formula 1.

It is more preferable to use the crystals with the compositions of:

$$Pb(Mg_{1/3}Nb_{2/3})_{1-y}Ti_yO_3 \quad (5)$$

where; y is defined as 0.25<y<0.33. With these rhombohedral compositions, <001> oriented crystals possess longitudinal couplings >85% with a maximum value of ~94%. However, if 0.33<y<0.40, the resulting composition is close to the MPB or lies on the MPB, resulting in <001> oriented rhombohedral $Pb(Mg_{1/3}Nb_{2/3})_{1-x}Ti_xO_3$ crystals which transform into a tetragonal phase at significantly lower electric fields, e.g., <10×coercive field (Ec).

Figure 1B:
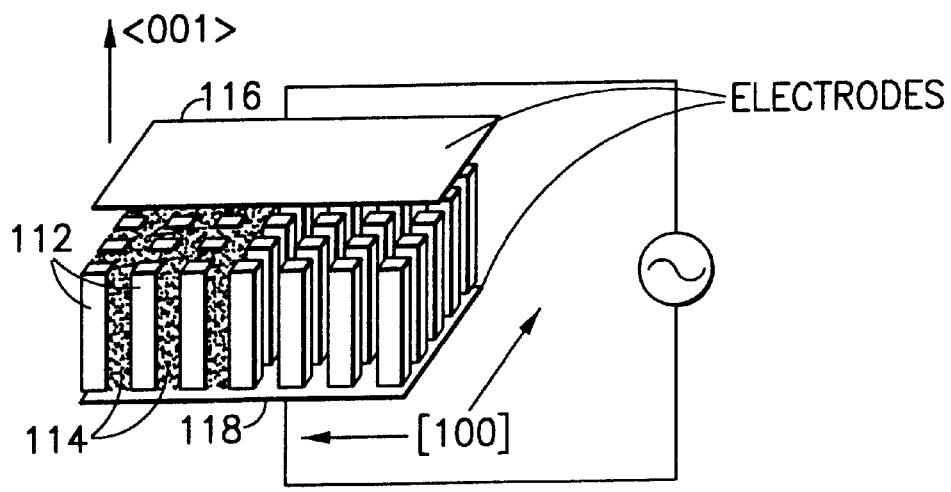

FIG. 1a shows an exploded view of 2—2 composite ultrasound transducer 100, comprising plural single crystal piezoelectric elements 102, encompassing polymer layers 104 and electrodes 106 and 108. FIG. 1b shows an exploded view of 1-3 composite ultrasound transducer 110, comprising plural single crystal piezoelectric elements 112, encompassing polymer layers 114 and electrodes 116 and 118.

Ultrasound transducer 100 is manufactured by the following method. Transducer fabrication from an as-grown single crystal began with orientation using a Laue back reflection camera. Once a reference face parallel to the (001) plane was polished into the crystal, the crystal was sliced parallel to the reference face to approximately 1 mm. This slice was then polished flat and gold sputtered on both sides. An electric field, as high as 10× the coercive field (Ec), was applied to pole the slice. Kerfs were cut into the material parallel to <100>, using standard dicing technology, such as a Kulicke and Soffa 782 wafer dicing saw. The cut spaces were then filled with polymer, such as Hysol 2038/3404 epoxy. The composite was polished again down to a determined thickness and gold was sputtered on both sides. To make sure poling was complete, electric fields as high as 10× Ec were then applied at temperatures above the polymer softening temperature (in this case 60° C.). The composite was then cooled, under dc-bias, to room temperature.

Figure 2B:
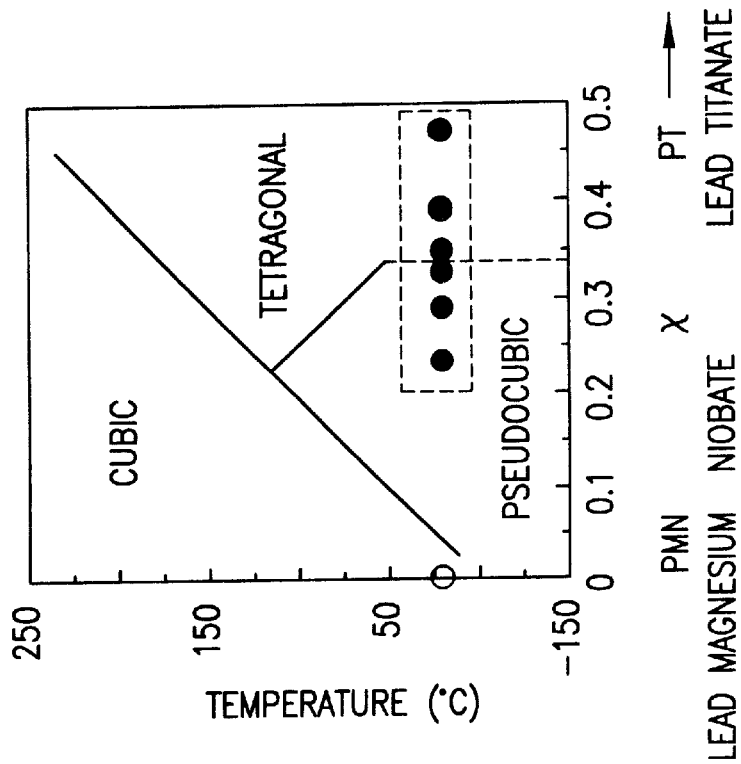
FIGS. 2a and 2b show the phase diagrams of lead zinc niobate—lead titanate and lead magnesium niobate—lead titanate solid solutions, respectively.
Figure 2A:
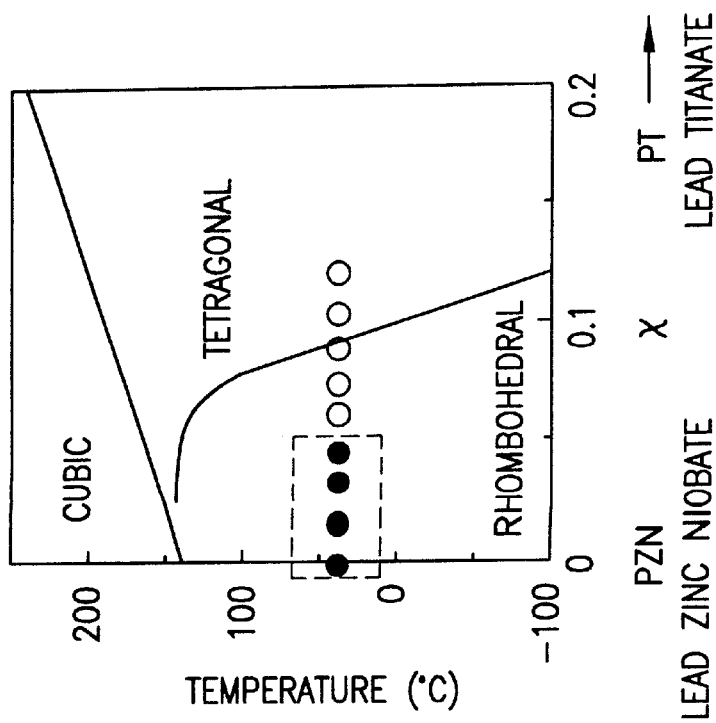

FIGS. 2a and 2b show phase diagrams of lead zinc niobate—lead titanate and lead magnesium niobate—lead titanate solid solutions, respectively. The dots reflect the crystal compositions tested in the process of making this invention, and the solid dots represent the compositions that fall within the claimed ranges of this invention.

Figure 3:
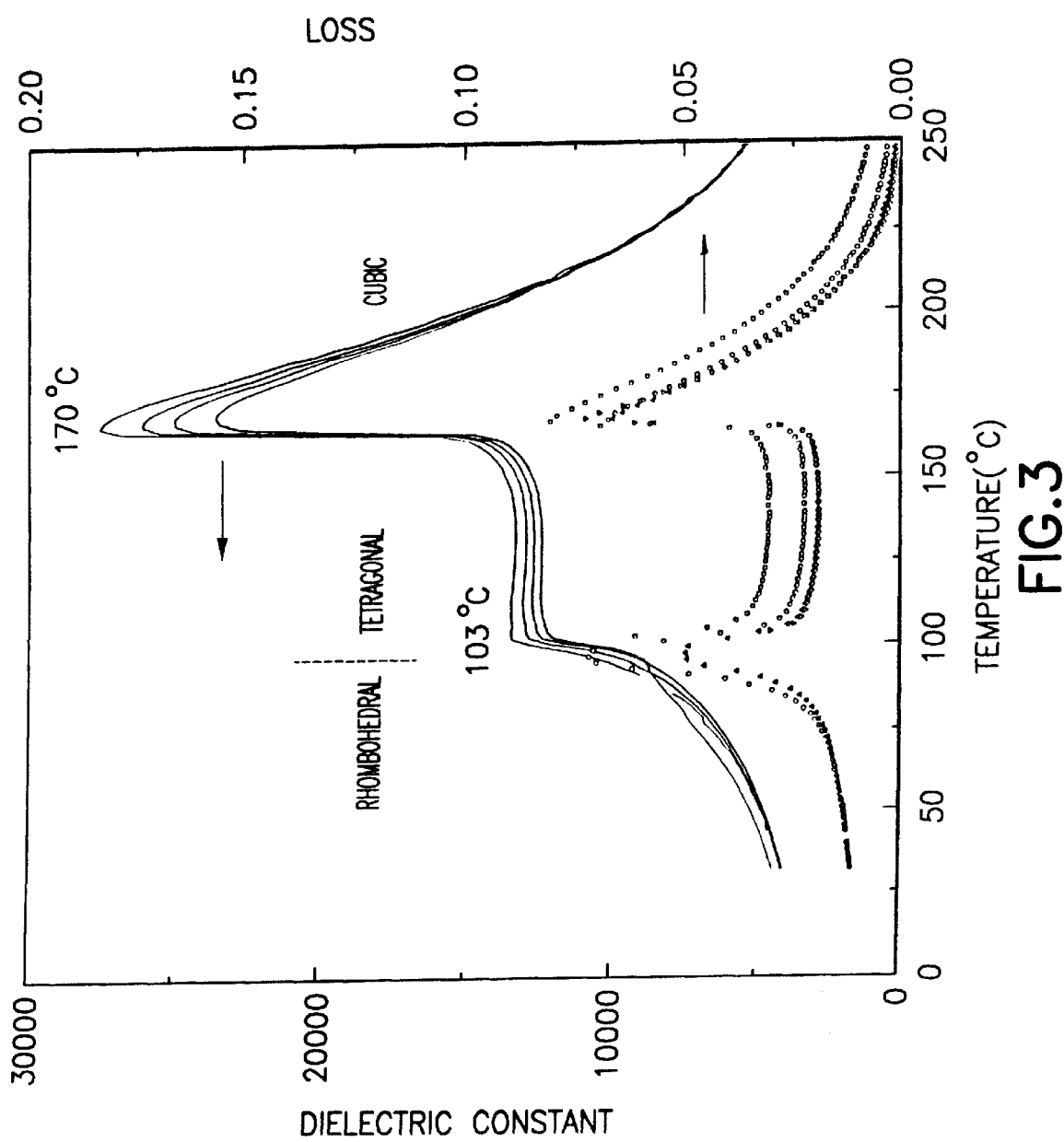
FIG. 3 shows a dielectric constant vs. temperature curve for $Pb(Zn_{1/3}Nb_{2/3})_{0.92}Ti_{0.08}O_3$, exhibiting transitions from rhombohedral to tetragonal (100° C.) and tetragonal to cubic (160° C.).

FIG. 3 shows variations of dielectric constant vs. temperature for $Pb(Zn_{1/3}Nb_{2/3})_{0.92}Ti_{0.08}O_3$, exhibiting transitions from rhombohedral to tetragonal (100° C.) and tetragonal to cubic (160° C.). Increased temperature, together with dc bias, cause the rhombohedral phase to readily transform to the tetragonal phase. This occurs for all <001> oriented rhombohedral crystals of lead zinc niobate—lead titanate ($Pb(Zn_{1/3}Nb_{2/3})_{1-x}Ti_xO_3$) andlead magnesium niobate—lead titanate ($Pb(Mg_{1/3}Nb_{2/3})_{1-y}Ti_yO_3$) solid solutions, where 0<x<0.09 and 0.15<y<0.35, respectively.

Stability of the rhombohedral phase during poling becomes an issue for 0.05<x<0.09 and 0.33<y<0.35, as transition fields are less than 10× Ec at room temperature (where the rhombohedral-tetragonal transition occurs at much lower field intensities with increased temperature). Also, rhombohedral phase stability issues limit transducer driving voltage, especially at high driving frequencies. To increase the driving frequency for enhanced sensitivity, the transducer must be thinner, resulting in an increased electric field at the same driving voltage. Therefore, use of a <001> rhombohedral crystal limits the transducer driving voltage, unless composition of the rhombohedral crystal is adjusted to be appropriately distant from the MPB.

Table 1 presents dielectric and piezoelectric properties, calculated based on IEEE standards, as a function of composition and crystal orientation. High longitudinal couplings ($k_{33}$>85%) can be observed with crystals oriented along the pseudocubic <001> direction. <111> oriented rhombohedral crystals of lead zinc niobate—lead titanate (Pb(Zn$_{1/3}$Nb$_{2/3}$)$_{1-x}$Ti$_x$O$_3$) and lead magnesium niobate—lead titanate (Pb(Mg$_{1/3}$Nb$_{2/3}$)$_{1-y}$Ti$_y$O$_3$), where 0<x<0.9 and 0.2<y<0.35, exhibited inferior couplings <40%. If 0.15<y<0.2, lead magnesium niobate—lead titanate (Pb(Mg$_{1/3}$Nb$_{2/3}$)$_{1-y}$Ti$_y$O$_3$) solid solutions possess longitudinal coupling <80%, only comparable to the conventional MPB ceramics such as PZT.

>80% can be observed for the compositions 0.2<y<0.5. Solid dots indicate coupling values as a function of compositions that are within the scope of the invention.

Figure 6A:
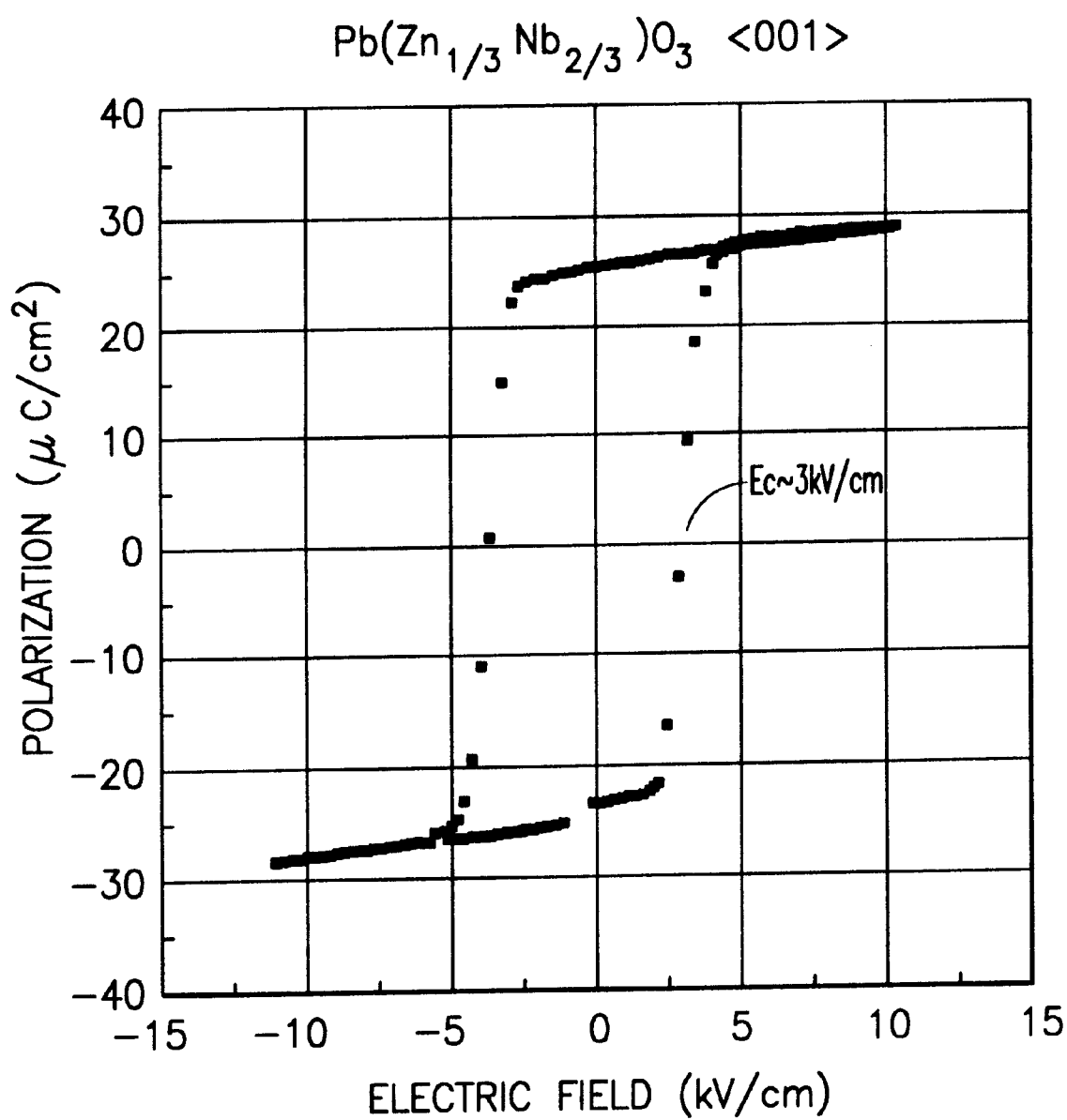
FIGS. 6a, 6b, 6c show $P=f(E)$ curves of <001> oriented lead zinc niobate—lead titanate $(Pb(Zn_{1/3}Nb_{2/3})_{l-x}Ti_xO_3)$ crystals for x=0, x=0.045, and x=0.08, respectively.
Figure 6B:
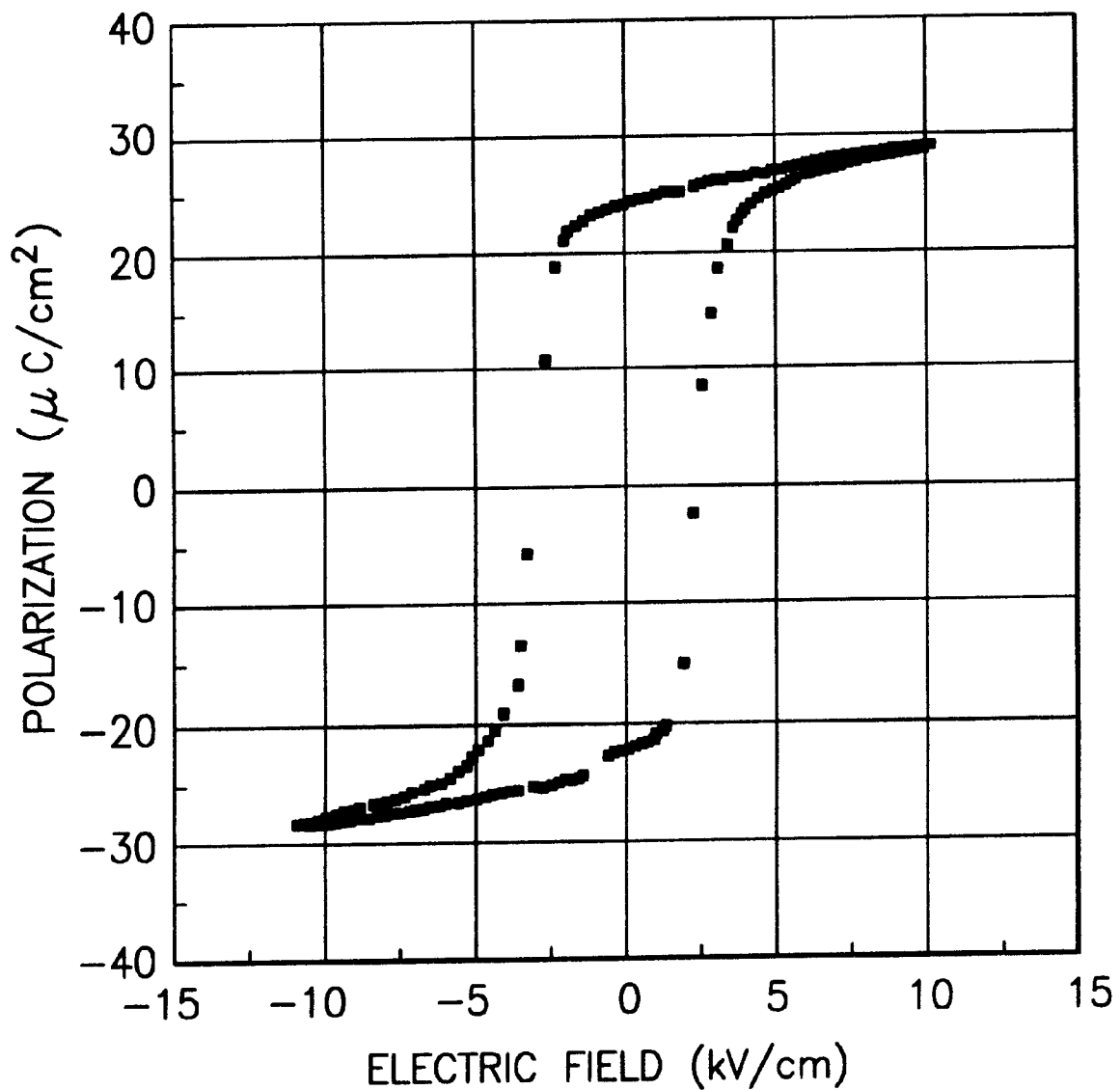
Figure 6C:
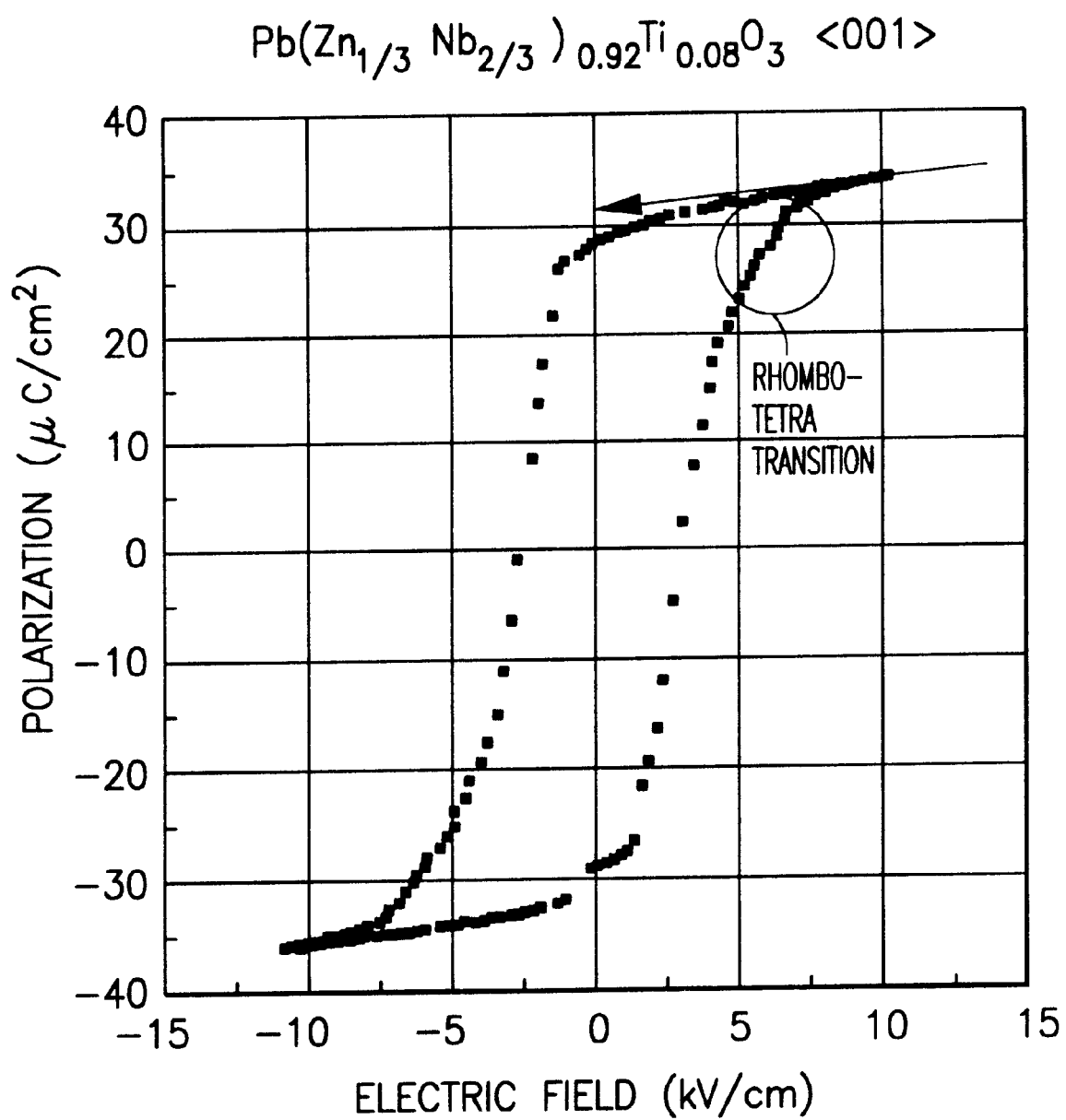

FIGS. 6a, 6b, 6c show P=f(E) curves of <001> oriented lead zinc niobate—lead titanate (Pb(Zn$_{1/3}$Nb$_{2/3}$)$_{1-x}$Ti$_x$O$_3$) crystals for x=0, x=0.045, and x=0.08, respectively. All <001> oriented crystals exhibited ferroelectric hysteresis similar to those observed with single domain switching, implying a stable domain configuration. Coercive fields (Ec), where orientation of ferroelectric domains occurs by application of an electric field, were found to be almost the same (~3 kV/cm) for all <001> oriented rhombohedral crystals. The larger Ps (35 $\mu$C/cm$^2$) and hump in P=f(E) curve observed with <001> oriented Pb(Zn$_{1/3}$Nb$_{2/3}$)$_{0.92}$Ti$_{0.08}$O$_3$) crystals are related to the rhombohedral to tetragonal phase transition.

Figure 7:
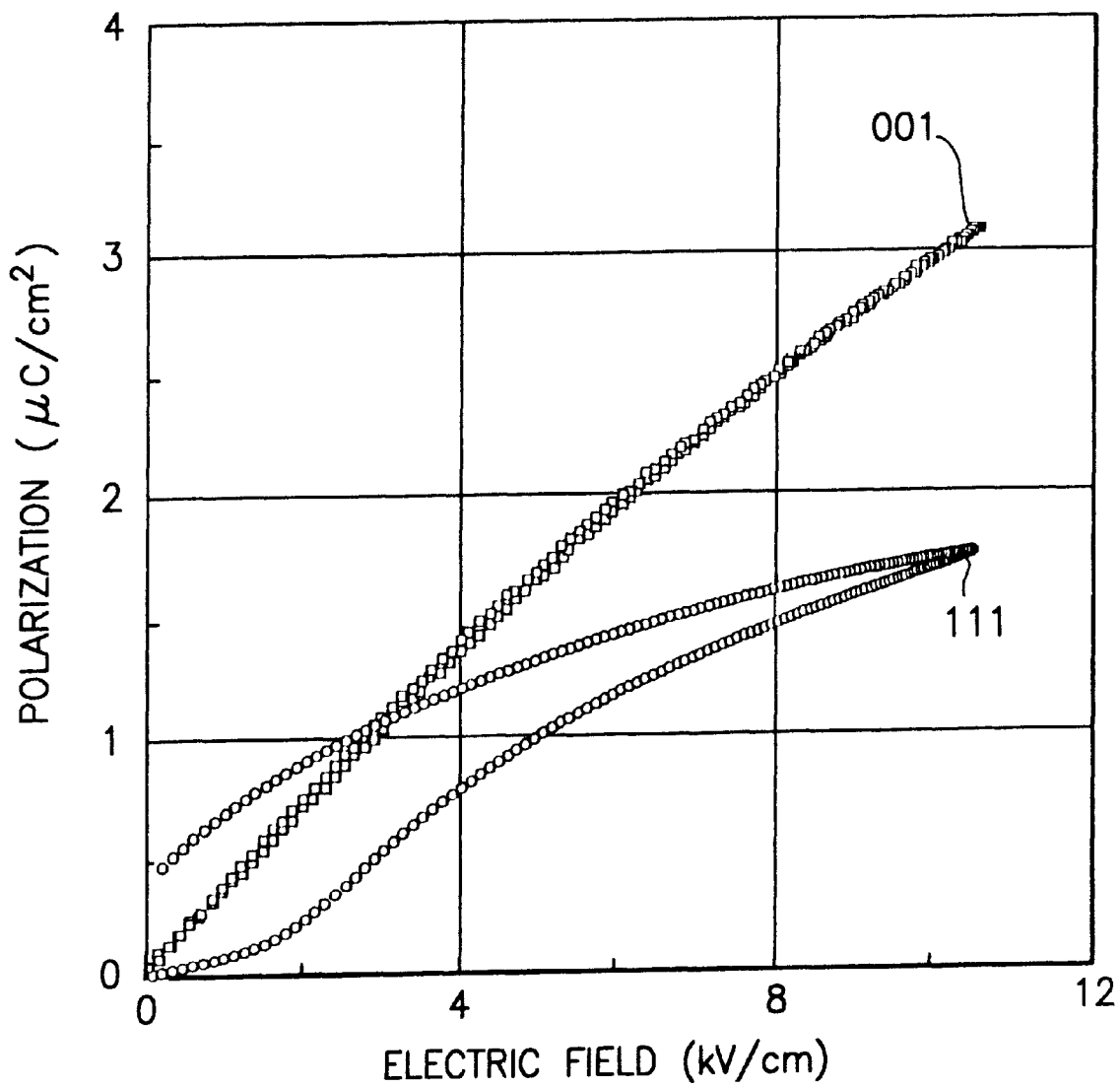
FIG. 7 shows $P=\eta(E)$ curves for <111> and <001> oriented lead zinc niobate—lead titanate $(Pb(Zn_{1/3}Nb_{2/3})_{l-x}Ti_xO_3)$ crystals for x=0, with applied unipolar electric fields, after poling (applying 10×Ec at room temperature).

FIG. 7 shows P=f(E) curves for <111> and <001> oriented lead zinc niobate—lead titanate (Pb(Zn$_{1/3}$Nb$_{2/3}$)$_{1-}$

TABLE 1

Piezoelectric Properties of various PZN-PT and PMN-PT crystals (longitudinal mode)

| Composition | Crystal Structure | Orient. | coupling | $S_{33}^E$ ($10^{-12}$m$^2$/N) | $K_3^1$ | loss | $d_{33}$ (pC/N) |
|---|---|---|---|---|---|---|---|
| PZN | Rhom[1] | 111 | 0.38 | 7.4 | 900 | 0.012 | 83 |
|  |  | 001 | 0.85 | 48 | 3600 | 0.008 | 1100 |
| PZN-2%PT | Rhom | 111 | 0.38 | 7.7 | 900 | 0.004 | 90 |
|  |  | 001 | 0.87 | 74 | 3800 | 0.010 | 1550 |
| PZN-4.5%PT | Rhom | 111 | 0.35 | 9.0 | 1500 | 0.004 | 110 |
|  |  | 001 | 0.92 | 102 | 4000 | 0.004 | 2000 |
| PZN-6%PT | Rhom | 111 | 0.33 | 7.3 | 710 | 0.004 | 74 |
|  |  | 001 | 0.93 | 130 | 4500 | 0.012 | 2400 |
| PZN-8%PT | Rhom | 111 | 0.39 | 7.4 | 2150 | 0.012 | 82 |
|  |  | 001 | 0.94 | 130 | 4200 | 0.012 | 2400 |
| PZN-9.5%PT | MPB[2] | 111 | 0.64 | 10.4 | 4300 | 0.007 | 600 |
|  |  | 001 | 0.89 | 77 | 1600 | 0.004 | 1600 |
| PZN-12%PT | Tetra[3] | 001 | 0.86 |  | 900 | 0.004 | 500 |
| PMN-24%PT | Rhom | 001 | 0.84 | 54 | 3700 | 0.009 | 900 |
| PMN-33%PT | Rhom | 001 | 0.94 | 79 | 4500 | 0.012 | 1700 |
| PMN-35%PT | MPB | 001 | 0.92 | 67 | 3100 | 0.014 | 1240 |
| PMN-40%PT | Tetra | 001 | 0.85 |  | 1000 | 0.005 |  |

[1]rhombohedral.
[2]morphotropic phase boundary-coexistence of both rhombohedral and tetragonal phases.
[3]tetragonal.

From Table 1, it can be concluded that compositions of lead magnesium niobate—lead titanate (Pb(Mg$_{1/3}$Nb$_{2/3}$)$_{1-y}$Ti$_y$O$_3$) crystals must be 0.20<y<0.50, in order to obtain ultrahigh couplings >80%. More particularly, compositions of lead magnesium niobate—lead titanate (Pb(Mg$_{1/3}$Nb$_{2/3}$)$_{1-y}$Ti$_y$O$_3$) crystals should preferably be 0.25<y<0.50 to have longitudinal couplings higher than 85%, comparable to lead zinc niobate—lead titanate (Pb(Zn$_{1/3}$Nb$_{2/3}$)$_{1-x}$Ti$_x$O$_3$). High couplings >85% with low dielectric constants (<1000) for tetragonal lead magnesium niobate—lead titanate (Pb(Mg$_{1/3}$Nb$_{2/3}$)$_{1-y}$Ti$_y$O$_3$) crystals 0.38<y<0.50) illustrate significant usefulness for single element transducers, as this type of transducer requires high electromechanical coupling, with a low dielectric constant for electrical impedence matching.

Figure 4:
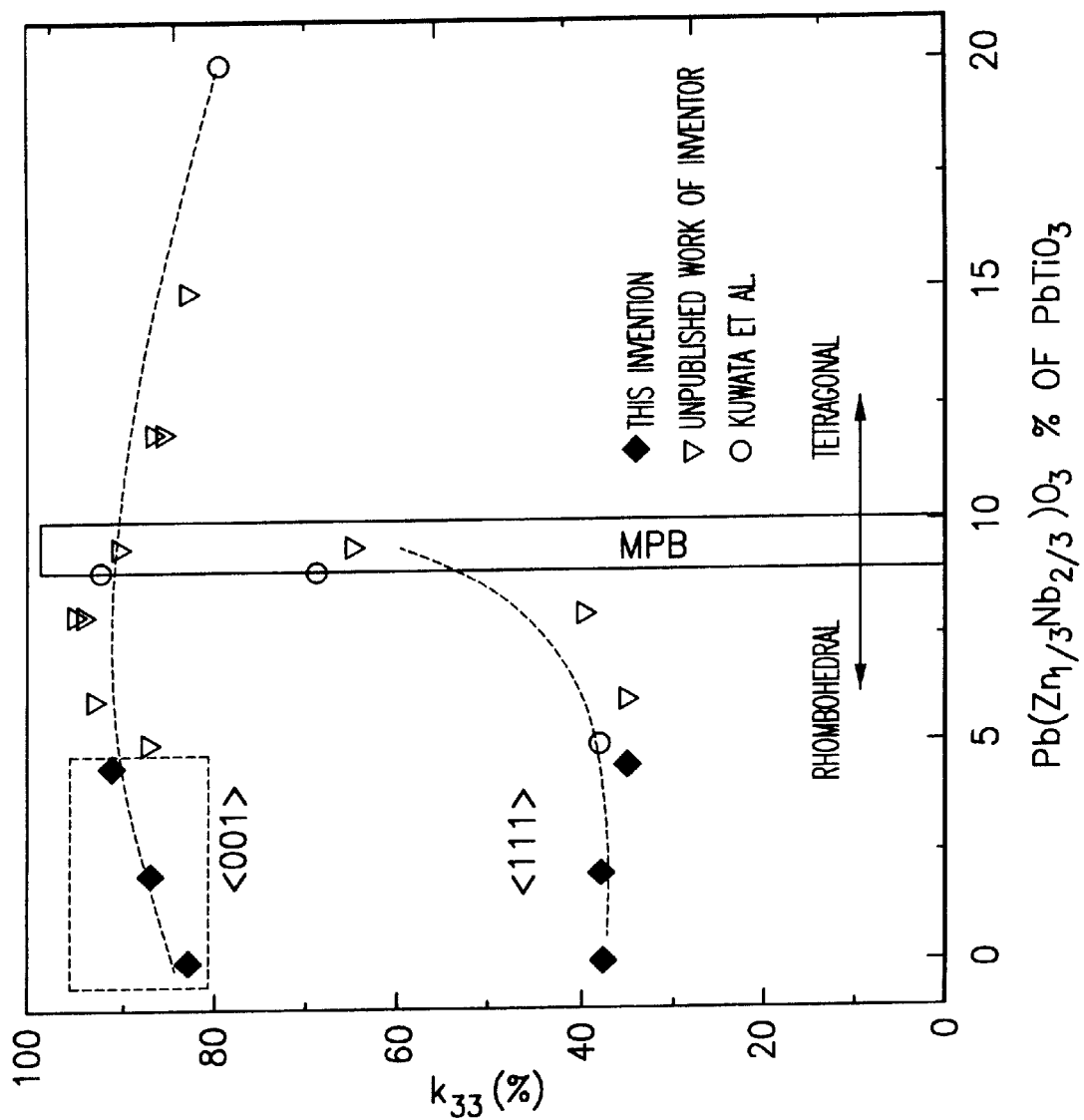
FIG. 4 shows longitudinal couplings as a function of composition and crystal orientation for lead zinc niobate—lead titanate $(Pb(Zn_{1/3}Nb_{2/3})_{l-x}Ti_xO_3)$.

FIG. 4 shows plots of longitudinal coupling as a function of composition and crystal orientation, for lead zinc niobate—lead titanate (Pb(Zn$_{1/3}$Nb$_{2/3}$)$_{1-x}$Ti$_x$O$_3$). It can be seen that closeness to the MPB is not essential to obtain ultrahigh coupling, if rhombohedral crystals are oriented along the <001> axis. Solid dots indicate coupling values as a function of compositions that are within the scope of the invention.

Figure 5:
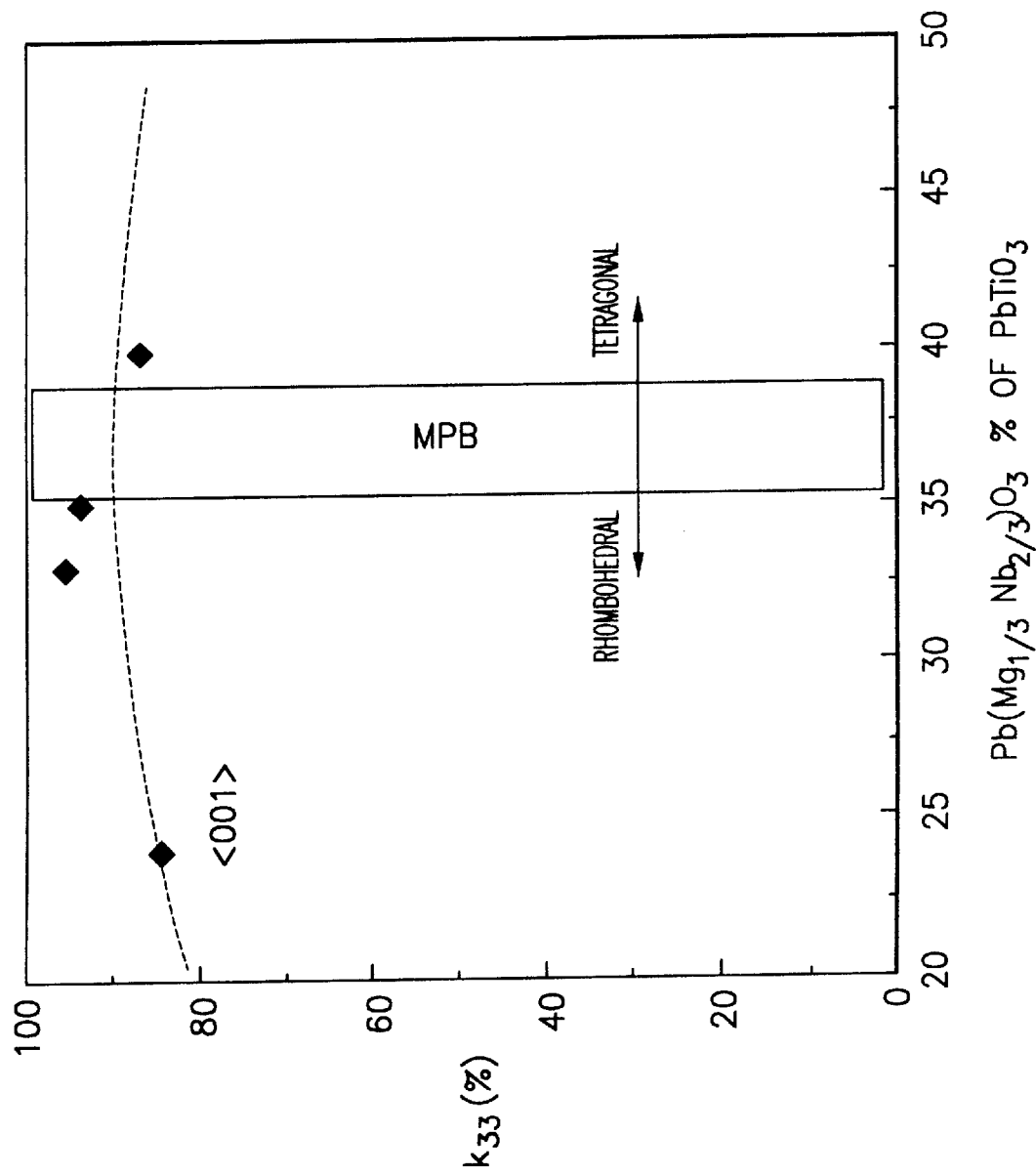
FIG. 5 shows longitudinal couplings as a function of composition and crystal orientation for lead magnesium niobate—lead titanate $(Pb(Mg_{1/3}Nb_{2/3})_{l-x}Ti_xO_3)$.

FIG. 5 shows plots of longitudinal coupling as a function of composition and crystal orientation for lead magnesium niobate—lead titanate (Pb(Mg$_{1/3}$Nb$_{2/3}$)$_{1-x}$Ti$_x$O$_3$). Couplings $x$Ti$_x$O$_3$) crystals for x=0, with a unipolar electric field applied, after poling (applying 10x Ec at room temperature). All <001> oriented rhombohedral crystals exhibited hysteresis-free behavior, resulting from a stable domain configuration. However, domain instability with <111> oriented rhombohedral crystals resulted in hysteresis in P=f(E) curves and inferior piezoelectric properties, as presented in Table 1.

Figure 8:
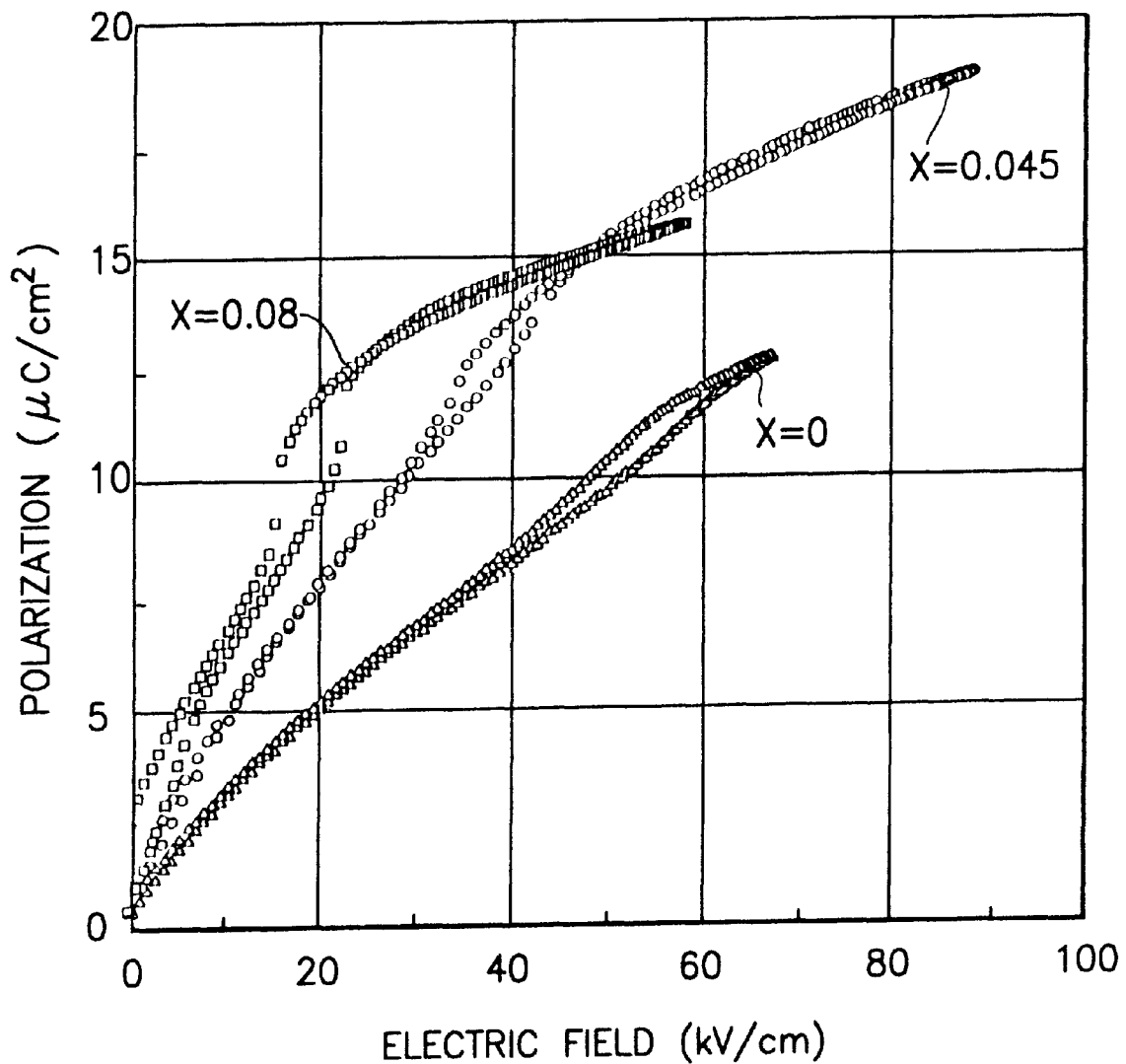
FIG. 8 shows $P=f(E)$ curves for <001> oriented lead zinc niobate—lead titanate $(Pb(Zn_{1/3}Nb_{2/3})_{l-x}Ti_xO_3)$ crystals for x=0, x=0.045, and x=0.08, respectively, with unipolar electric field applied after poling (applying 10×Ec at room temperature).

FIG. 8 shows P=f(E) curves for <001> oriented lead zinc niobate—lead titanate (Pb(Zn$_{1/3}$Nb$_{2/3}$)$_{1-x}$Ti$_x$O$_3$) crystals for x=0, x=0.045, and x=0.08, respectively, with an applied unipolar electric field, after poling (applying 10x Ec at room temperature). Each crystal exhibited a discontinuous increase in polarization at the electric fields, the amount of which was inversely proportional to x. This discontinuous increase in P=f(E) curves and resultant hysteresis are caused by an electric field-induced phase transformation, i.e., rhombohedral to tetragonal transition for <001> oriented rhombohedral crystals.

Figure 9:
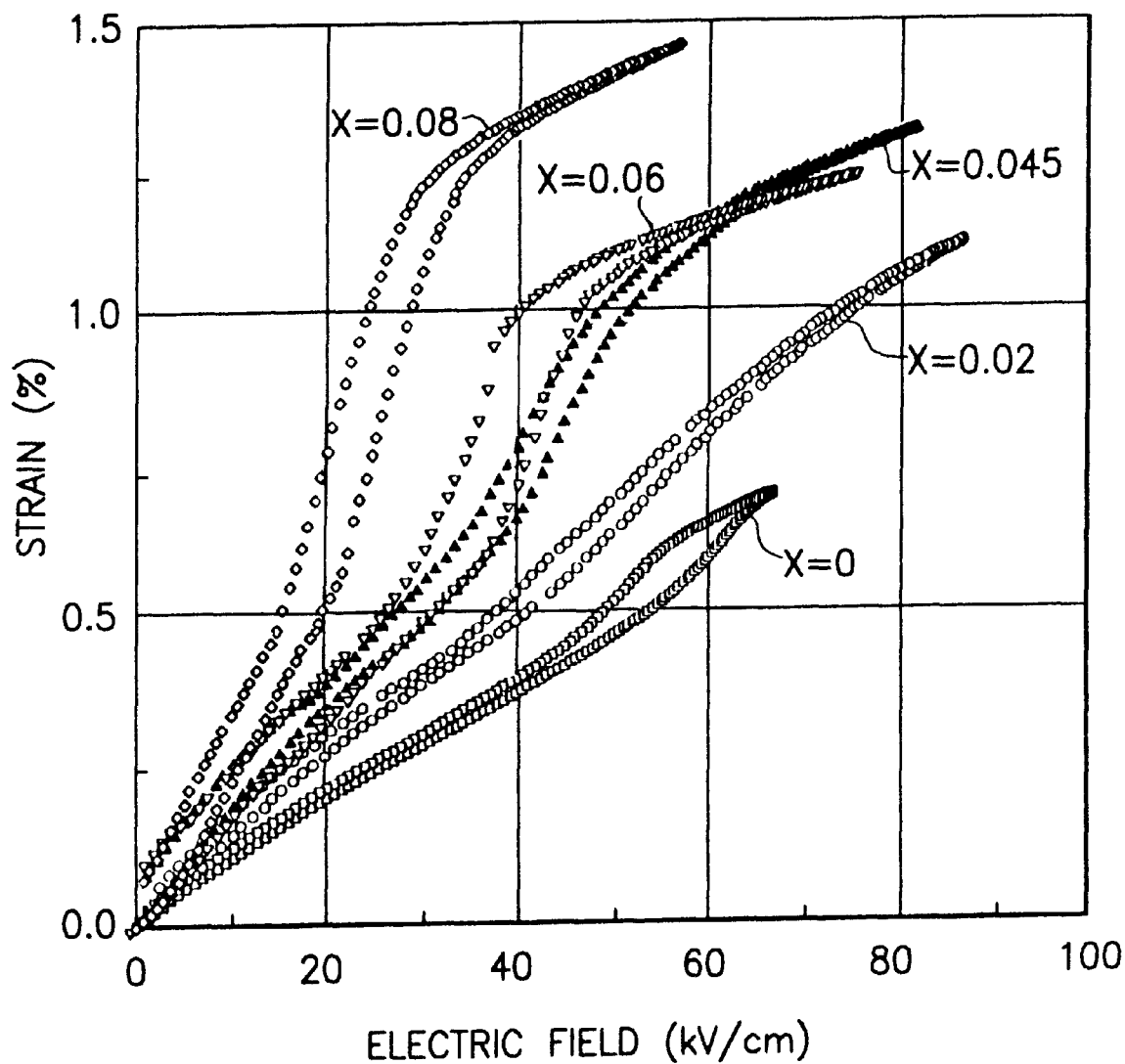
FIG. 9 shows strain vs. electric field curves for <001> oriented lead zinc niobate—lead titanate $(Pb(Zn_{1/3}Nb_{2/3})_{l-x}Ti_xO_3)$ crystals for x=0, x=0.02, x=0.045, x=0.06 and x=0.08, respectively, with unipolar electric field applied after poling (applying 10×Ec at room temperature).

FIG. 9 shows strain vs. electric field curves for <001> oriented lead zinc niobate—lead titanate (Pb(Zn$_{1/3}$Nb$_{2/3}$)$_{1-x}$Ti$_x$O$_3$) crystals for x=0, x=0.02, x=0.045, x=0.06 and x=0.08, respectively, with an applied unipolar electric field, after poling (applying 10x Ec at room temperature). Associated with the phase transition, strain increased abruptly and a large hysteresis can be observed. This large strain during the induced phase transition, resulted in an increased fabrication failure rate and limited the transducer driving voltage.

Figure 10:
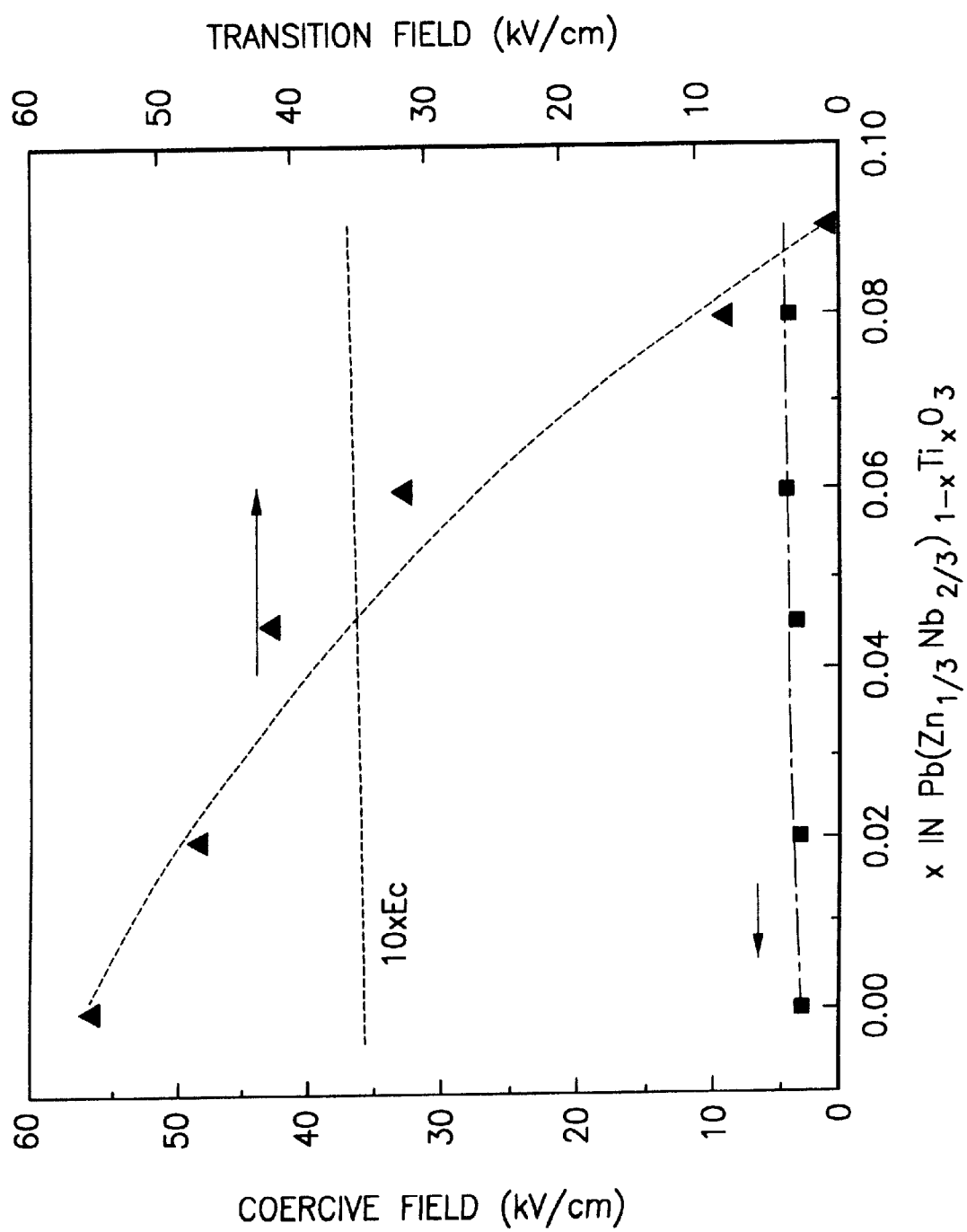
FIG. 10 shows Ec and phase transition fields as a function of composition, for <001> oriented lead zinc niobate—lead titanate $(Pb(Zn_{1/3}Nb_{2/3})_{l-x}Ti_xO_3)$ crystals.

FIG. 10 shows Ec and phase transition fields as a function of composition, for <001> oriented lead zinc niobate—lead titanate $(Pb(Zn_{1/3}Nb_{2/3})_{1-x}Ti_xO_3)$ crystals. Ec (~3 kV/cm) does not vary significantly as a function of composition, but the transition field is strongly dependent upon composition. Electric fields >10× Ec can be applied without causing a phase transformation at room temperature for <001> oriented lead zinc niobate—lead titanate $(Pb(Zn_{1/3}Nb_{2/3})_{1-x}Ti_xO_3)$ crystals, when compositions are 0<x<0.05. Crystals with compositions 0<x<0.05 have a Tc lower than those x>0.05, possibly resulting in more temperature dependent properties, and less polarization stability. However, as shown in the phase diagram of lead zinc niobate—lead titanate $(Pb(Zn_{1/3}Nb_{2/3})_{1-x}Ti_xO_3$, FIG. 2), Tc increases with increased x, whereas the rhombohedral—tetragonal transition temperature decreases, the latter being more critical during fabrication and driving. Also, transducer temperature can be maintained constant by using PTCR (positive temperature coefficient resistor) ceramics such as doped $BaTiO_3$.

Figure 11:
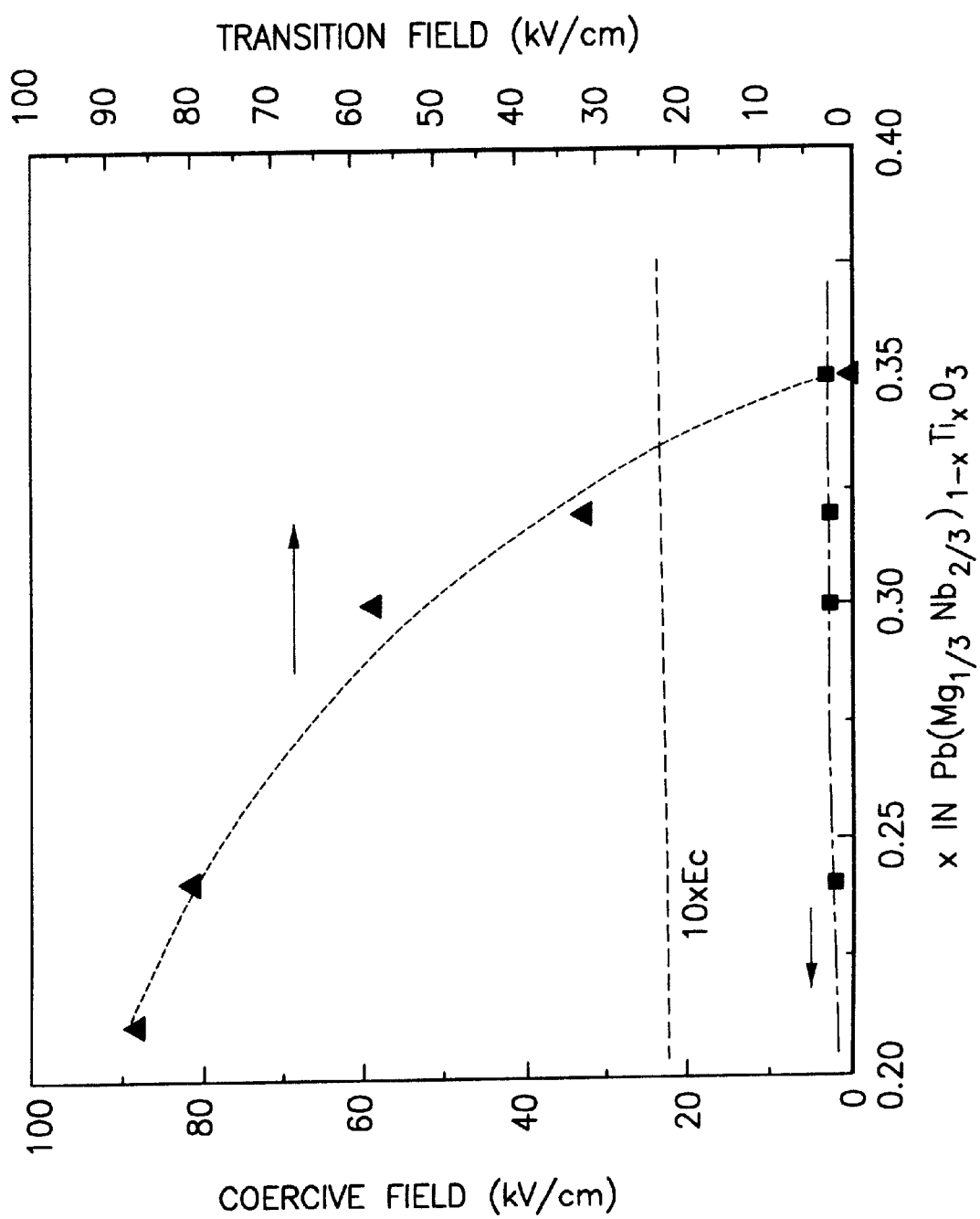
FIG. 11 shows Ec and phase transition fields as a function of composition for <001> oriented lead magnesium niobate—lead titanate $(Pb(Mg_{1/3}Nb_{2/3})_{l-y}Ti_yO_3)$ crystals.

FIG. 11 shows Ec and phase transition fields as a function of composition for <001> oriented lead magnesium niobate—lead titanate $(Pb(Mg_{1/3}Nb_{2/3})_{1-y}Ti_yO_3)$ crystals. Ec(~3 kV/cm) does not vary significantly as a function of composition, but the transition field is strongly dependent upon composition. Electric fields >10× Ec can be applied without causing a phase transformation at room temperature for <001> oriented lead magnesium niobate—lead titanate $(Pb(Mg_{1/3}Nb_{2/3})_{1-y}Ti_yO_3)$ crystals, when compositions are y<0.33.

Experimental

Transducers using <001> oriented rhombohedral $Pb(Zn_{1/3}Nb_{2/3})_{0.955}Ti_{0.045}O_3$ crystals and rhombohedral $Pb(Zn_{1/3}Nb_{2/3})_{0.92}Ti_{0.08}O_3$ crystals were manufactured as shown in FIG. 1. As-grown single crystals were oriented using a Laue back reflection camera. Once a reference face parallel to the (001) plane was polished into the crystal, the crystals were sliced parallel to the reference face to approximately 1 mm. The slice was then polished flat, and gold was sputtered on both sides. Electric fields as high as 10× Ec were applied to pole the disk. Kerfs were cut into the material, parallel to <100>, using standard dicing technology such as a Kulicke and Soffa 782 wafer dicing saw. The cut spaces were then filled with polymers such as Hysol 2038/3404 epoxy. The composite was polished again down to a determined thickness and gold was sputtered on both sides. To make sure poling was complete, electric fields as high as ~10×Ec were then applied at temperatures above the polymer softening temperature (in this case ~60° C.). The composite was cooled under dc-bias, down to room temperature.

Table 2 presents longitudinal coupling values ($k_{33}$) for a single element transducer and couplings measured from a 2×2 composite ($k_{bar}$). Mechanical clamping by tall and narrow element shape (lateral clamping) and by the rigid polymer results in decreased values of $k_{bar}$. However, further decreases in $k_{bar}$ can be found in example 2 below, with increased mechanical failure resulting from the phase transformation during poling. It should be noted that, even though a single longitudinal bar having a composition closer to the MPB exhibits higher couplings, subsequent couplings of composites are higher for the compositions that are positioned away from MPB.

TABLE 2

| Composition | orientation | $k_{33}$ for single element | $k_{bar}$ for 2-2 composite | survived transducers |
|---|---|---|---|---|
| example 1 $Pb(Zn_{1/3}Nb_{2/3})_{0.955}Ti_{0.045}O_3$ | <001> | 92% | 89% | 90% |
| example 2 $Pb(Zn_{1/3}Nb_{2/3})_{0.92}Ti_{0.08}O_3$ | <001> | 94% | 70% | 75% |

Piezoelectric Actuators

It has been found that certain single crystal ferroelectrics will evidence very high strain values if their constituents restrict their crystalline form to the rhombohedral structure and an electric field is applied thereacross so as to be in general alignment with the <001> crystallographic axis. Such ferroelectrics exhibit very low levels of hysteresis and thus may be driven at relatively high frequencies without overheating. The materials comprising the invention are preferably in solid solution form.

Single crystalline ferroelectrics, which exhibit large strain and low hysteresis and are usable with actuators incorporating the invention, are solid solutions of lead zinc niobate—lead titanate or lead magnesium niobate—lead titanate, which possesses a large piezoelectric coefficient ($d_{33}$~1000 pC/N to 2500 pC/N), and a maximum strain >1.2%.

Figure 12:
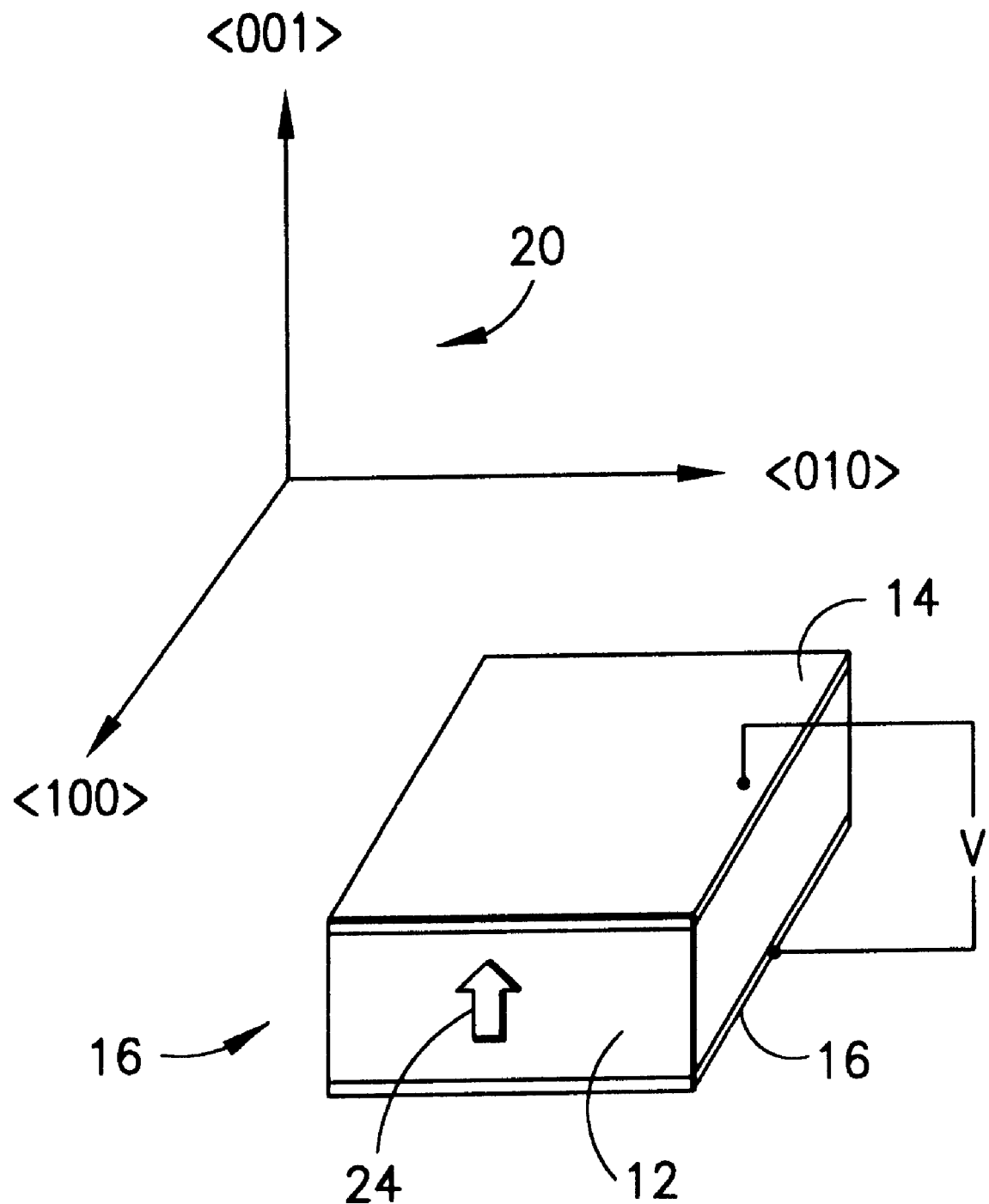
FIG. 12 shows a perspective view of an actuator incorporating a single crystalline ferroelectric wherein an electric field is applied along the <001> crystallographic axis.

In FIG. 12, an actuator 10 incorporating the invention comprises a ferroelectric body 12 that is bounded by conductive electrodes 14 and 16. Body 12 comprises a single crystal solid solution of the chosen ferroelectric composition and the crystal axes of the crystal are generally aligned as shown by coordinates 20. When a voltage V is applied across electrodes 14 and 16, ferroelectric body 12 is poled as shown by arrow 24.

A ferroelectric single crystal according to the present invention is described by formulae 1 and 2 below:

$$Pb(Zn_{1/3}Nb_{2/3})_{1-x}Ti_xO_3 \tag{6}$$

$$Pb(Mg_{1/3}Nb_{2/3})_{1-y}Ti_yO_3 \tag{7}$$

where: x and y are defined as 0<x<0.10, and 0<y<0.40, respectively. If x>0.1 and y>0.4, the single crystals have a tetragonal structure with piezoelectric coefficients as low as 500 pC/N.

A more preferred range of limits for x and y are 0<x<0.09, and 0<y<0.35, resulting in rhombohedral crystalline structure. In the range of 0.09<x<0.1 and 0.35<y<0.4, crystals lie on morphotropic phase boundaries (MPB), with coexisting rhombohedral and tetragonal phases. In spite of observed strain as high as 1% and large low field piezoelectric coefficients ($d_{33}$ ⊕1500 pC/N) for MPB crystals, large hysteresis associated with domain motion and phase transition is observed when strain is plotted versus applied electric field for such MPB crystals. Thus while such compositions are usable and exhibit large strain values, their range of applications is not as wide as materials in the more preferred ranges of x and y.

Piezoelectric single crystals of formulae 6 and 7 should be oriented and poled generally along the pseudocubic <001> direction to obtain a large strain value with little or no hysteresis effects.

Experimental

The piezoelectric coefficients ($d_{33}$) of lead zinc niobate—lead titanate and lead magnesium niobate—lead titanate solid solution single crystals were measured using direct observation of strain as a function of electric field as well as calculations based on IRE standards.

The crystals were fabricated as follows: High purity (>99.9%) powders of $Pb_3O_4$, ZnO, $MgCO_3$, $Nb_2O_5$ and $TiO_2$ were used as starting material. Raw powders were weighed with desired molar ratio with excess $Pb_3O_4$ as a flux. The powder was dry mixed for a desired period of time using a tumbling mill. Mixed powder was loaded into a platinum crucible, which was then placed in an alumina crucible sealed with an alumina lid and alumina cement to minimize PbO volatilization. The crucible and powder were then placed in a tube furnace and held at an appropriate soak temperature above melting temperature, followed by slow cooling. The crucible was then furnace-cooled to room temperature. Hot $HNO_3$ was used to separate the crystals out of the rest of the melt.

Crystals of lead zinc niobate—lead titanate and lead magnesium niobate—lead titanate solid solutions can similarly be fabricated using a top seeded solution growth method (TSSG), a submerged seeded solution growth method, Kyropoulous method, the hydrothermal method, solid state reaction via exaggerated grain growth and the Bridgman method, in addition to the flux method described above. Also, single crystals or pseudocrystals that consist of multiple single crystals of lead zinc niobate—lead titanate and lead magnesium niobate—lead titanate solid solutions can be fabricated using textured growth or epitaxial growth, that is, the growth of crystals of one material on the crystal surface of another material, such that the crystalline substrates of both materials have the same structural orientation.

The piezoelectric properties were measured as follows: Individual crystals were oriented along their pseudocubic <111>, <110> and <001> directions using a Laue back reflection camera. For electrical characterization, samples were prepared by polishing with silicon carbide and alumina polishing powders to achieve flat and parallel surfaces onto which gold electrodes were sputtered.

High-field measurements included polarization and strain hysteresis using a linear variable differential transducer (LVDT) driven by a lock-in amplifier (Stanford Research Systems, Model SR830). Plate shape samples with the thickness ranged from 0.2 mm to 0.5 mm were used. The voltage was supplied using a Trek 609C-6 high voltage DC amplifier. Through the LVDT sensor the strain of the samples was measured with the application of applied fields. Electric fields as high as ~140 kV/cm were applied using an amplified unipolar wave form at 0.2 Hz.

During testing the samples were submerged in Fluorinert (FC-40, 3M, St. Paul, Minn.), an insulating liquid, to prevent arcing. For piezoelectric coefficient($d_{33}$) determination, bar shape samples with the lengths which ranged from 3 mm to 5 mm were used. Piezoelectric coefficient ($d_{33}$) was calculated based on IRE standards.

Figure 13B:
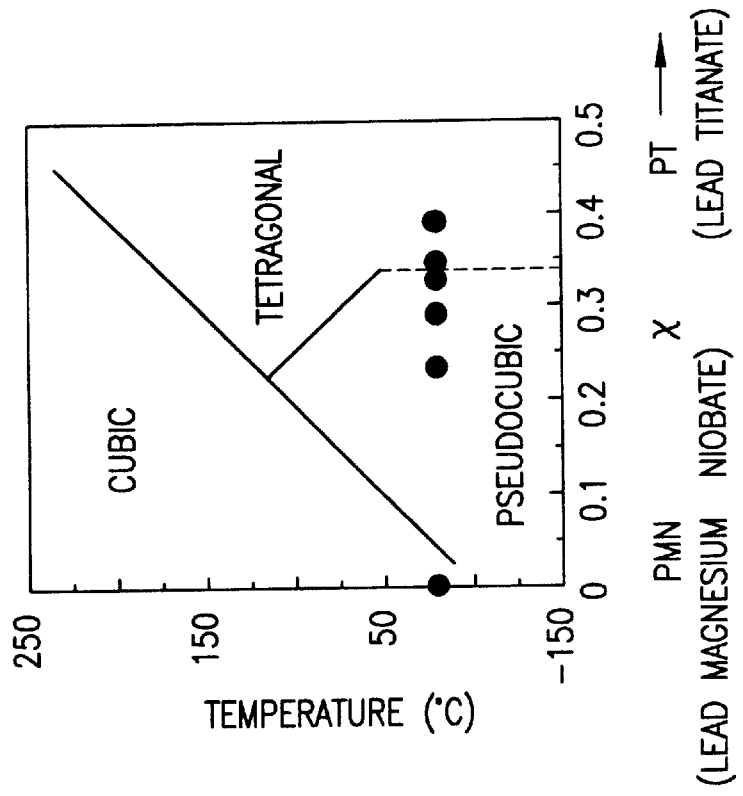
FIGS. 13a, 13b shows phase diagrams of lead zinc niobate—lead titanate and lead magnesium niobate—lead titanate solid solutions.
Figure 13A:
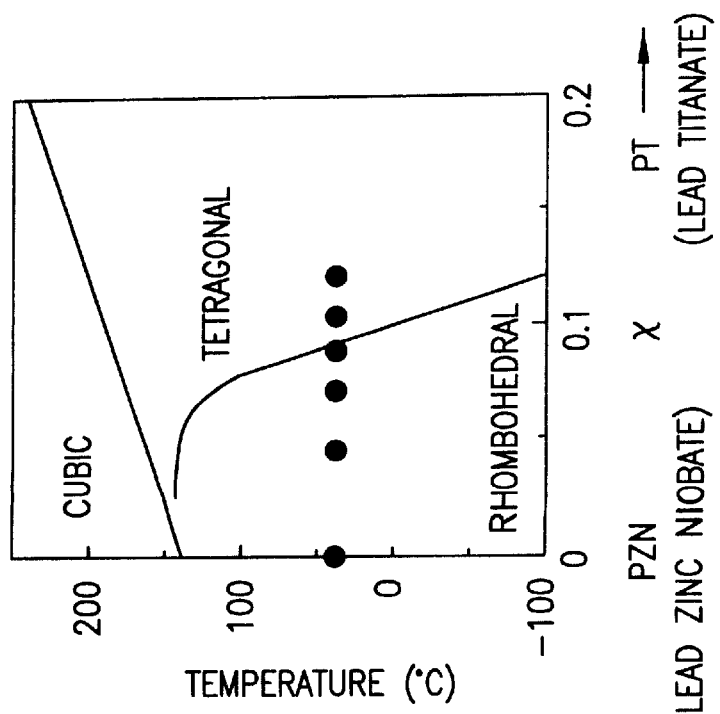

FIGS. 13a and 13b show phase diagrams of lead zinc niobate—lead titanate and lead magnesium niobate—lead titanate solid solutions, respectively. The solid dots are the crystal compositions which were tested during the development of the invention.

Table 3 presents low field dielectric and piezoelectric properties, calculated based on IRE standards, as a function of composition and crystal orientation. High piezoelectric coefficient ($d_{33}$>1000 pC/N) crystals had a rhombohedral structure or MPB composition and orientation along pseudocubic <001> direction. Piezoelectric coefficients as high as 2200 were measured for (001) oriented rhombohedral crystals of $Pb(Zn_{1/3}Nb_{2/3})_{0.92}Ti_{0.08}O_3$

TABLE 3

Low Field Piezoelectric Properties of Various PZN-PT and PMN-PT Crystals.

| Composition | Crystal Structure | Orient. | coupling | $s_{33}^E$ ($10^{-12}m^2/M$) | $K_3^T$ | loss | $d_{33}$ (pC/N) |
|---|---|---|---|---|---|---|---|
| PZN | Rhom[1] | 111 | 0.38 | 7.4 | 900 | 0.012 | 83 |
| | | 001 | 0.85 | 48 | 3600 | 0.008 | 1100 |
| PZN-4.5%PT | Rhom | 111 | 0.35 | 9.0 | 1500 | 0.004 | 110 |
| | | 001 | 0.91 | 102 | 4000 | 0.004 | 2000 |
| PZN-8%PT | Rhom | 111 | 0.39 | 7.4 | 2150 | 0.012 | 82 |
| | | 001 | 0.94 | 130 | 4200 | 0.012 | 2200 |
| PZN-9.5%PT | MPB[2] | 111 | 0.64 | 10.4 | 4300 | 0.007 | 600 |
| | | 001 | 0.89 | 77 | 1600 | 0.004 | 1600 |
| PZN-12%PT | Tetra[3] | 001 | 0.86 | | 900 | 0.004 | 500 |
| PMN-24%PT | Rhom | 001 | | | 3700 | 0.009 | 900 |
| PMN-33%PT | Rhom | 001 | 0.94 | 79 | 4500 | 0.012 | 1700 |
| PMN-35%PT | MPB | 001 | 0.92 | 67 | 3100 | 0.014 | 1240 |

[1]rhombohedral.
[2]morphotropic phase boundary-coexistence of both rhombohedral and tetragonal phases.
[3]tetragonal.

Figure 14:
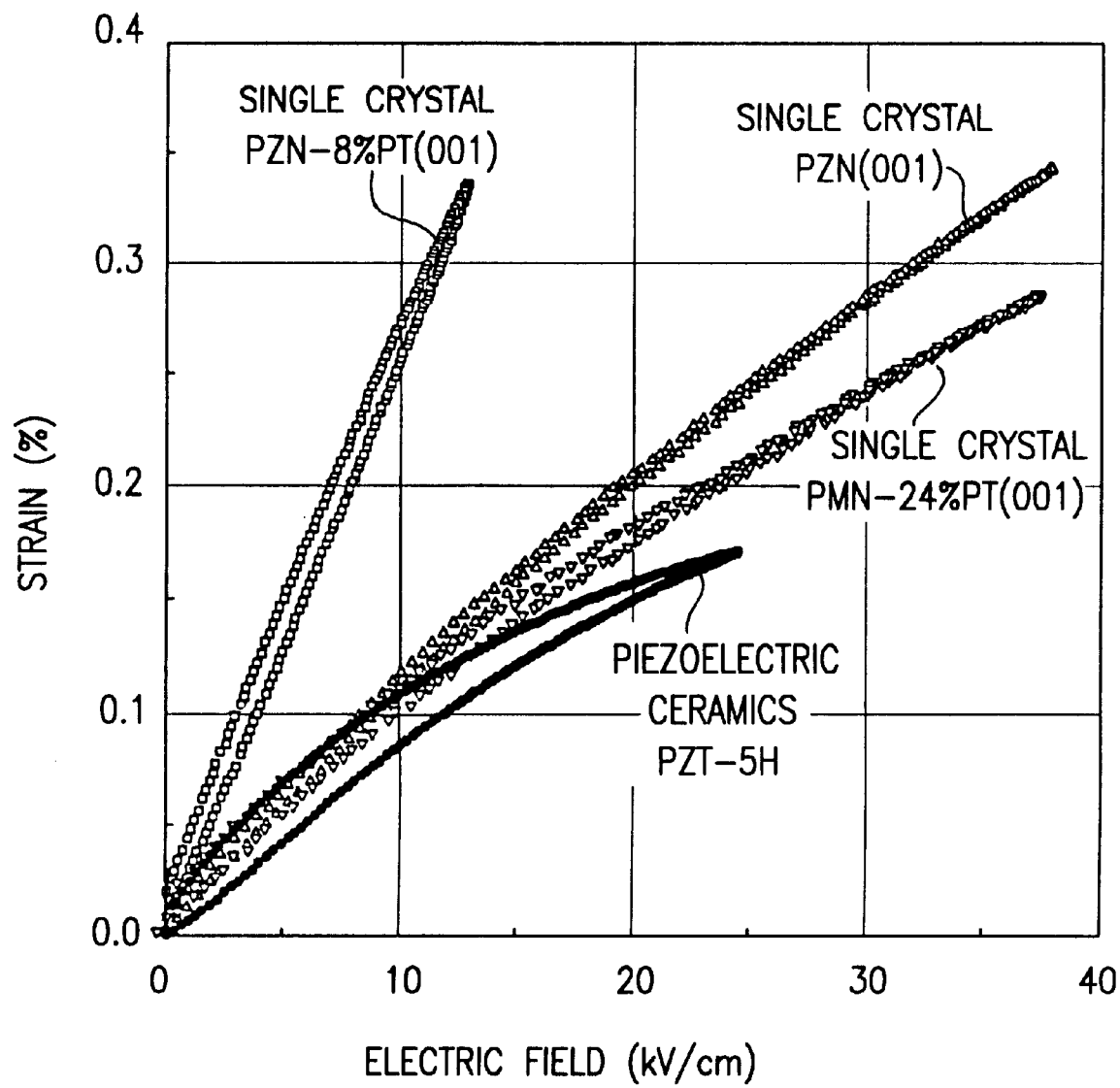
FIG. 14 shows a plot of strain as a function of electric field for <001> oriented rhombohedral crystals $Pb(Zn_{1/3}Nb_{2/3})_{l-x}Ti_xO_3$, (x=0.0, 0.045, 0.08) and $Pb(Mg_{1/3}Nb_{2/3})_{l-y}Ti_yO_3$, (y=0.24).

FIG. 14 shows a plot of strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-y}Ti_yO_3$ (y=0.24)). Piezoelectric coefficients ($d_{33}$) directly calculated from the slope of strain vs. electric field curves confirmed the values of piezoelectric coefficients presented in Table 3. A $d_{33}$ value >2500 pC/N was directly measured from the slope of the strain versus electric field curve for a <001> oriented $Pb(Zn_{1/3}Nb_{2/3})_{0.92}Ti_{0.08}O_3$ crystal.

Low hysteresis behaviors are apparent from the plots of FIG. 14. That behavior can be ascribed to a stable domain configuration. Strain behavior of piezoelectric ceramics (PZT-5H) with the largest piezoelectric coefficient ($d_{33} \sim 750$ pC/N) is compared with those of single crystals in the Fig.

Figure 15:
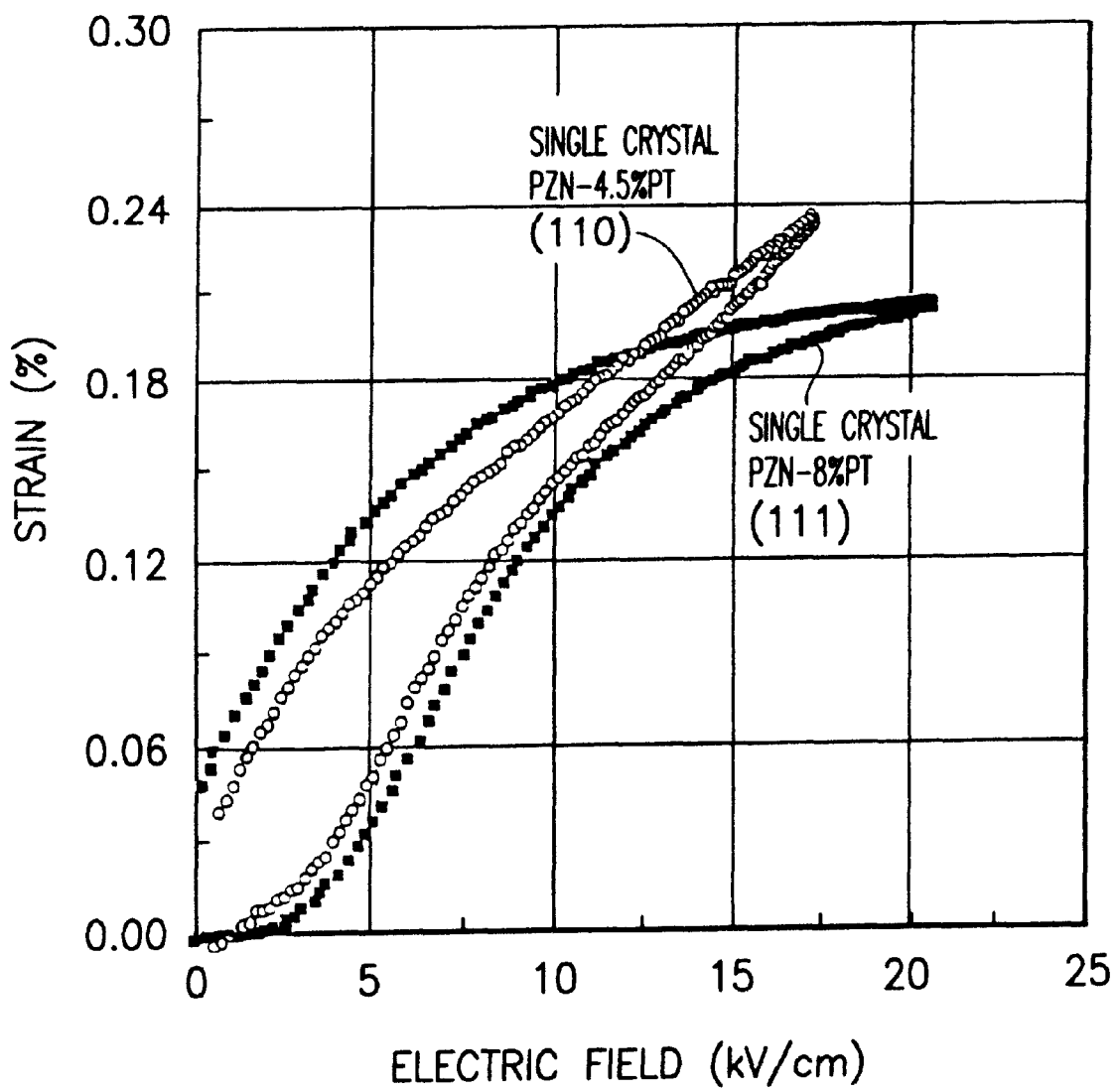
FIG. 15 shows plots of strain vs. electric field for samples with different crystal orientations.

FIG. 15 shows examples of strain vs. electric field for samples with different crystal orientations. $Pb(Zn_{1/3}Nb_{2/3})_{0.92}Ti_{0.08}O_3$ crystal oriented along the pseudocubic <111> and <001> directions and a $Pb(Zn_{1/3}Nb_{2/3})_{0.955}Ti_{0.045}O_3$ crystal oriented along the pseudocubic <110> direction were chosen as examples. E-field induced strain deviated from linearity and exhibited large hysteresis due to domain motion for crystals oriented along <111> and <110> directions. It was concluded that pseudocubic <001> was the direction resulting in a hysteresis strain.

Figure 16:
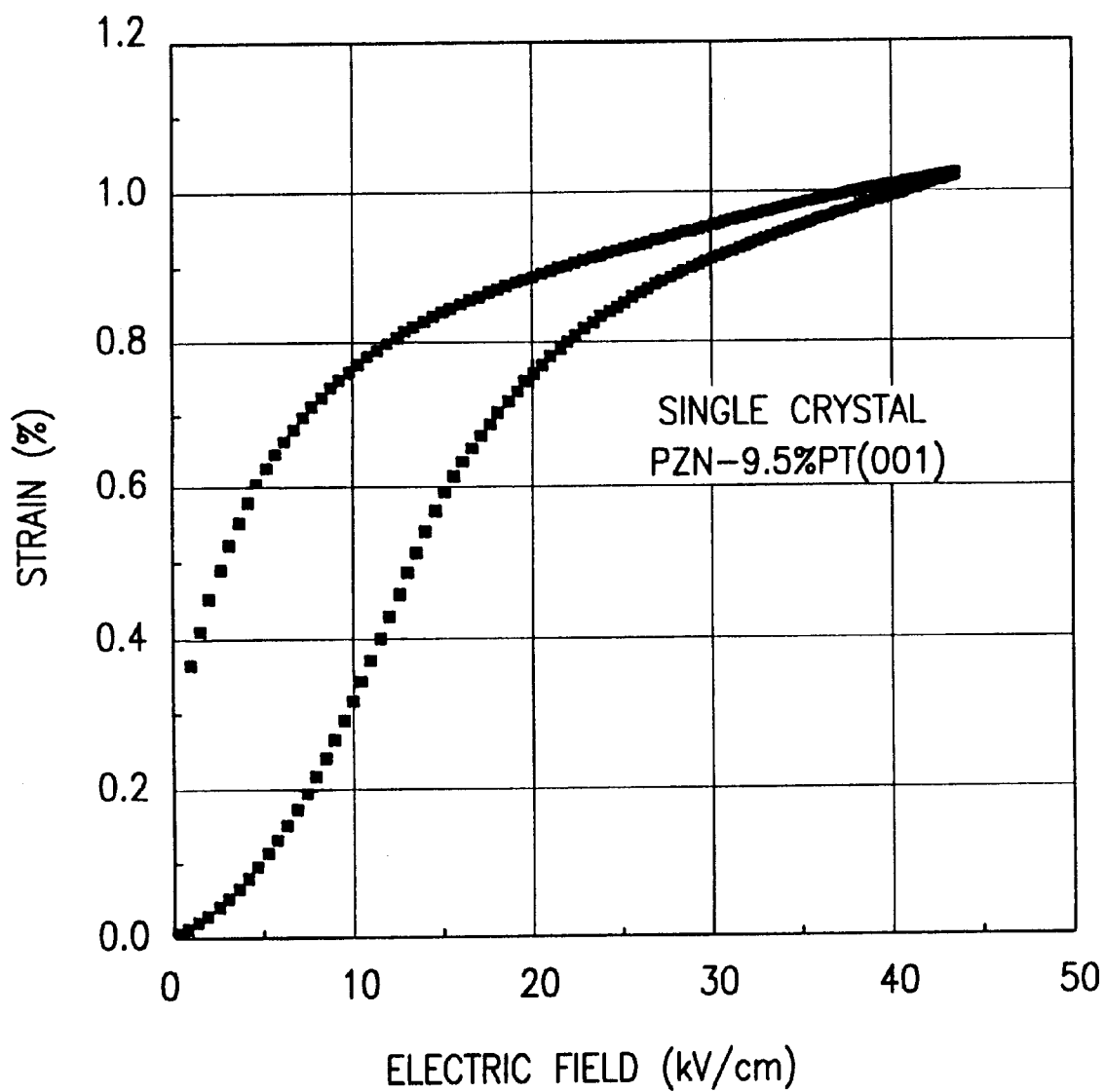
FIG. 16 shows plots of strain vs. electric field for <001> oriented $Pb(Zn_{1/3}Nb_{2/3})_{0.905}Ti_{0.095}O_3$ crystal as an example of MPB behavior.

FIG. 16 shows the strain vs. electric field curve for <001> oriented $Pb(Zn_{1/3}Nb_{2/3})_{0.905}Ti_{0.095}O_3$ crystal as an example of MPB behavior. Strain as high as 1% was observed, with large hysteresis due to the electric field induced domain motion. It is believed that the rhombohedral-tetragonal phase transition is also related to this hysteresis. It was concluded that the crystal must be rhombohedral to have low hysteresis strain behavior.

Figure 17:
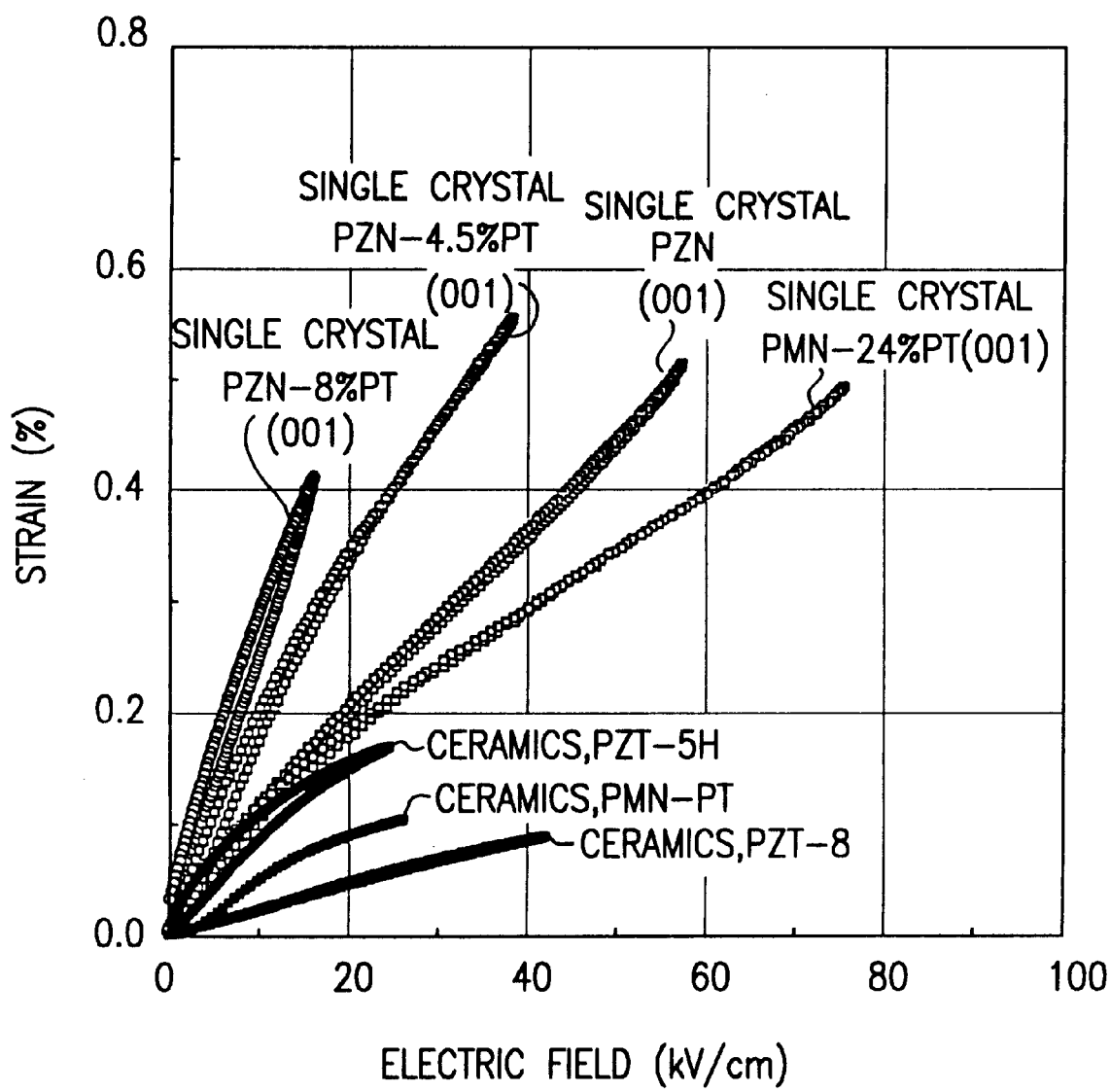
FIG. 17 shows plots of strain as a function of electric field for various <001> oriented rhombohedral crystals $(Pb(Zn_{1/3}Nb_{2/3})_{l-x}Ti_xO_3$, (x=0,0.045,0.08) and $Pb(Mg_{1/3}Nb_{2/3})_{l-y}Ti_yO_3$, (y=0.24), where hysteresis is low up to the maximum applied electric field.

FIG. 17 shows the strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-y}Ti_yO_3$ (y=0.24)), where hysteresis is low, up to the maximum applied electric field. Low hysteresis strain up to 0.55% was observed. Strains of various piezoelectric ceramics such as soft PZT (PZT-5H), hard PZT (PZT-8) and of electrostrictive ceramics are compared in the Fig.

Figure 18:
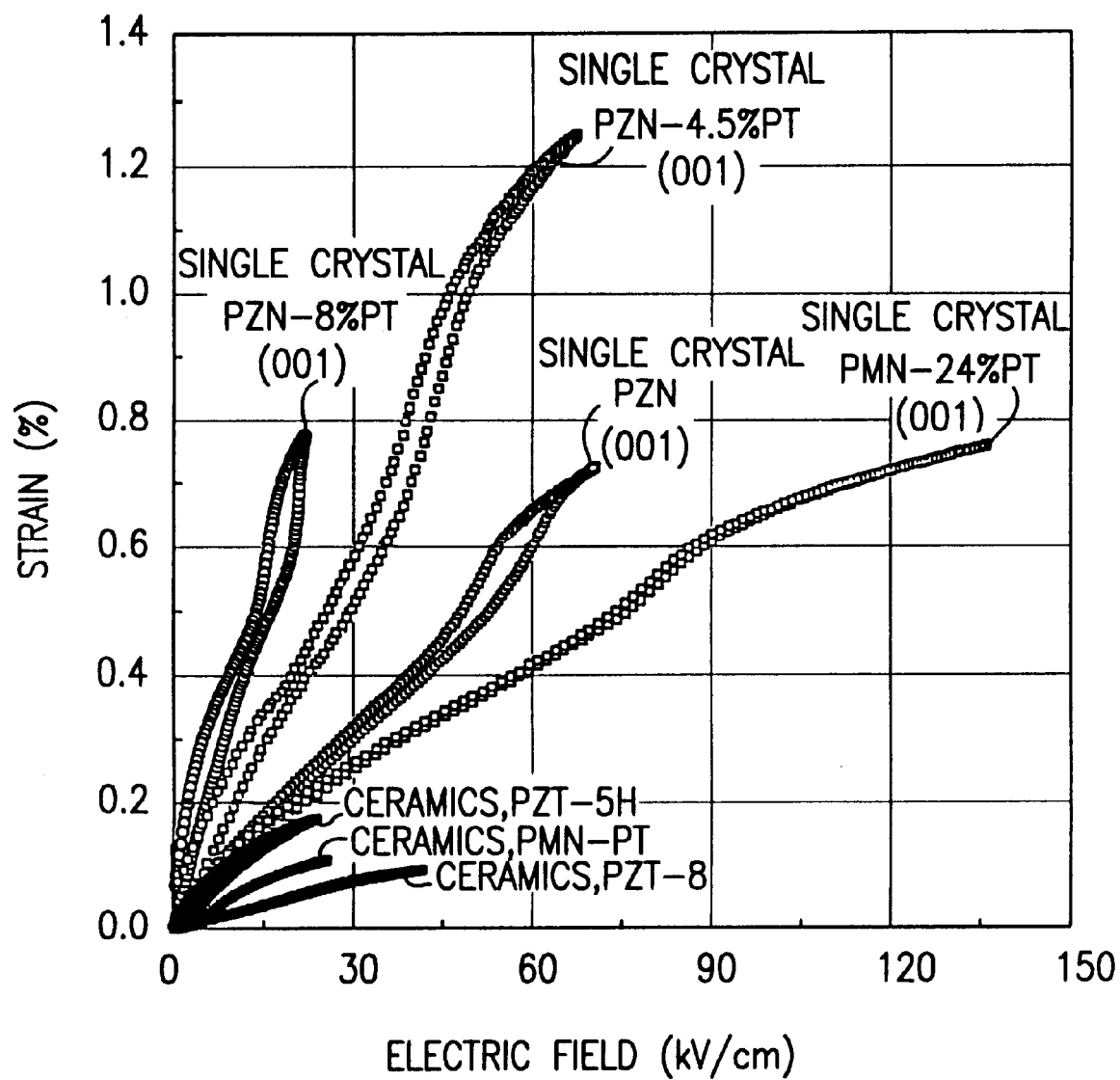
FIG. 18 shows plots of strain as a function of electric field for various <001> oriented rhombohedral crystals $(Pb(Zn_{1/3}Nb_{2/3})_{l-x}Ti_xO_3$, (x=0,0.045,0.08) and $Pb(Mg_{1/3}Nb_{2/3})_{l-y}Ti_yO_3$, (y=0.24)), where electric field is applied until the samples electrically break down.
Figure 19:
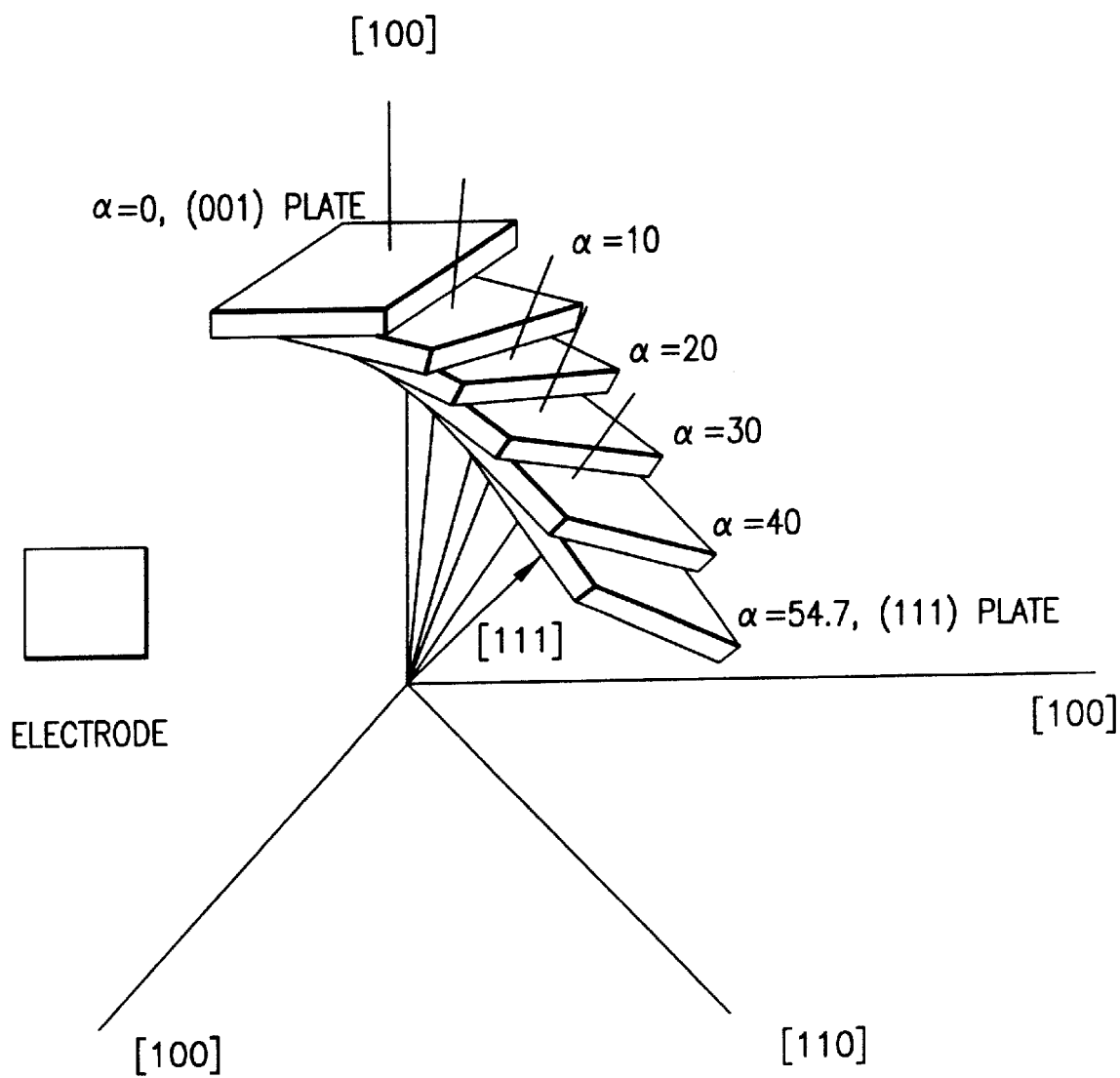
FIG. 19 shows representative $Pb(Zn_{1/3}Nb_{2/3})_{0.955}Ti_{0.045}O_3$ crystals oriented along <001>+α direction, where α is the degree of deviation toward <111> from the exact <001> direction.

FIG. 18 shows the strain as a function of electric field for various <001> oriented rhombohedral crystals ($Pb(Zn_{1/3}Nb_{2/3})_{1-x}Ti_xO_3$ (x=0, 0.045, 0.08) and $Pb(Mg_{1/3}Nb_{2/3})_{1-y}Ti_yO_3$ (y=0.24)), where electric field is applied until the samples electrically break down. Samples undergo an electric field induced rhombohedral-tetragonal transition, resulting in hysteresis. Strains as high as 0.8% were observed for all tested crystal samples. $Pb(Zn_{1/3}Nb_{2/3})_{0.955}Ti_{0.045}O_3$ crystal did not experience electric break down within the voltage limit of apparatus, resulting in strain >1.2%.

FIGS. 19–22 are plots which demonstrate that strain values of materials having the preferred composition ratios vary when the electric field is not aligned with the <001> crystallographic axis. However it is to be noted that so long as the electric field vector is within ±20°, that acceptable strain values and hysteresis levels are obtained. More specifically, FIG. 8 shows representative $Pb(Zn_{1/3}Nb_{2/3})_{0.955}Ti_{0.045}O_3$ crystals oriented along <001>+α direction, where α is the degree of deviation toward <111> from the exact <001> direction. This Fig. illustrates the deviation of the crystal orientation from an electric field applied along the <001> axis.

Figure 20:
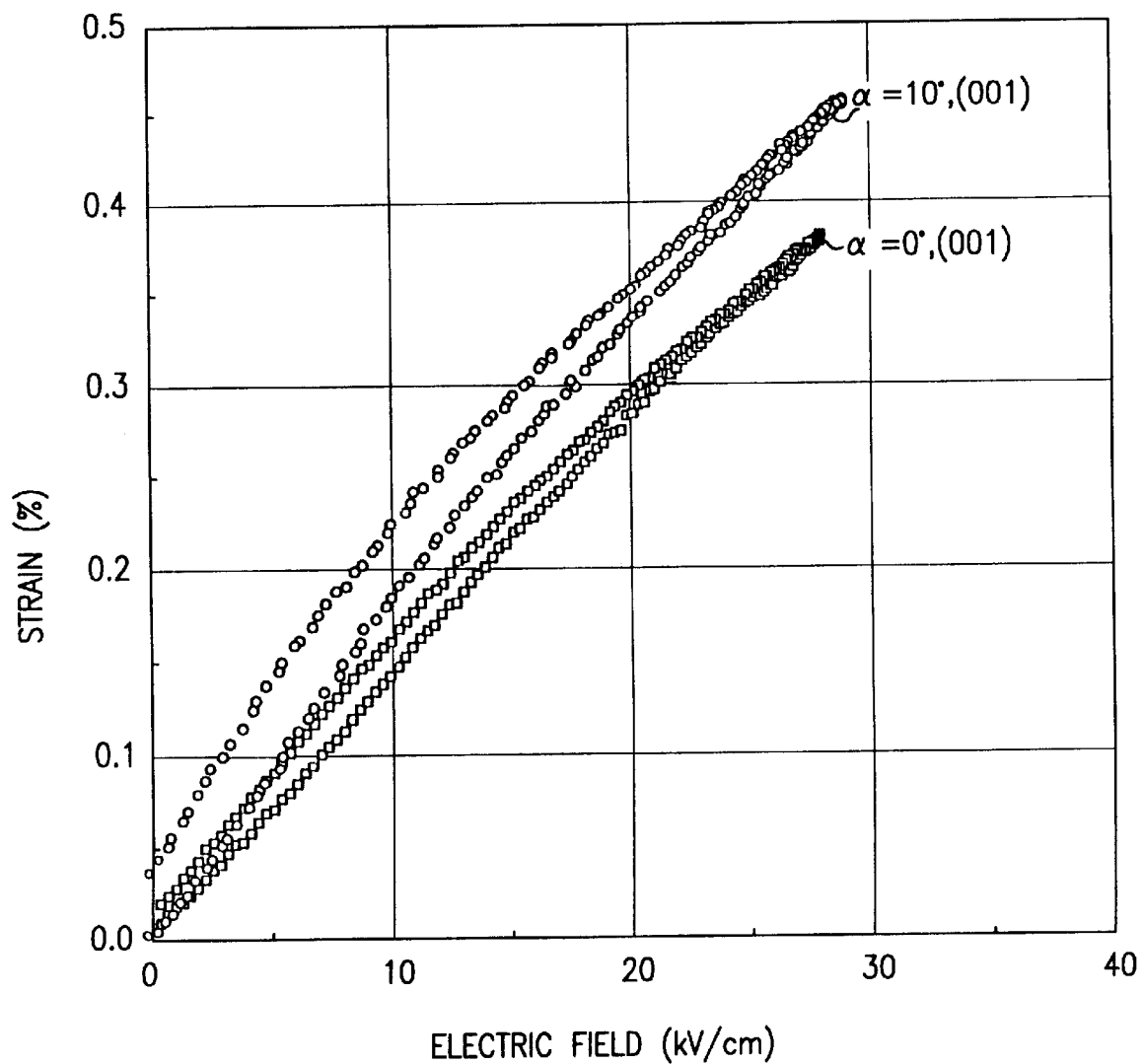
FIGS. 20, 21 show plots of low field (<40 kV/cm) strain behavior for $Pb(Zn_{1/3}Nb_{2/3})_{0.955}Ti_{0.045}O_3$ crystals oriented along <001>+α direction, where α is the degree of deviation toward <111> from the exact <001> direction, for various values of α.
Figure 21:
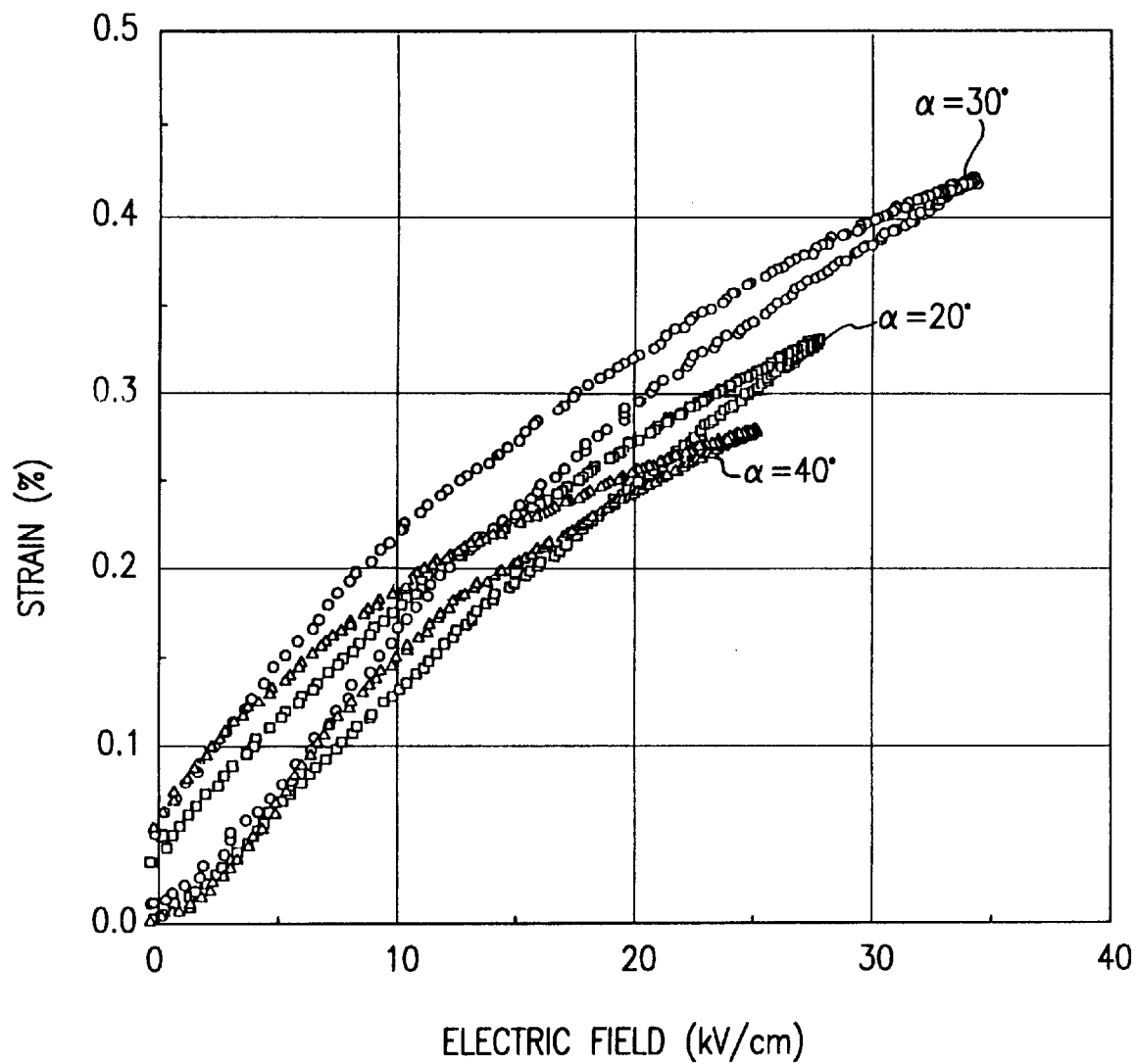

FIGS. 20, 21 show plots of low field (<40 kV/cm) strain behavior for $Pb(Zn_{1/3}Nb_{2/3})_{0.955}Ti_{0.045}O_3$ crystals oriented along <001>+α direction, were α is the degree of deviation toward <111> from the exact <001> direction, for various values of α. It is to be noted that when α exceeds 20°, the level of hysteresis increases substantially.

Figure 22:
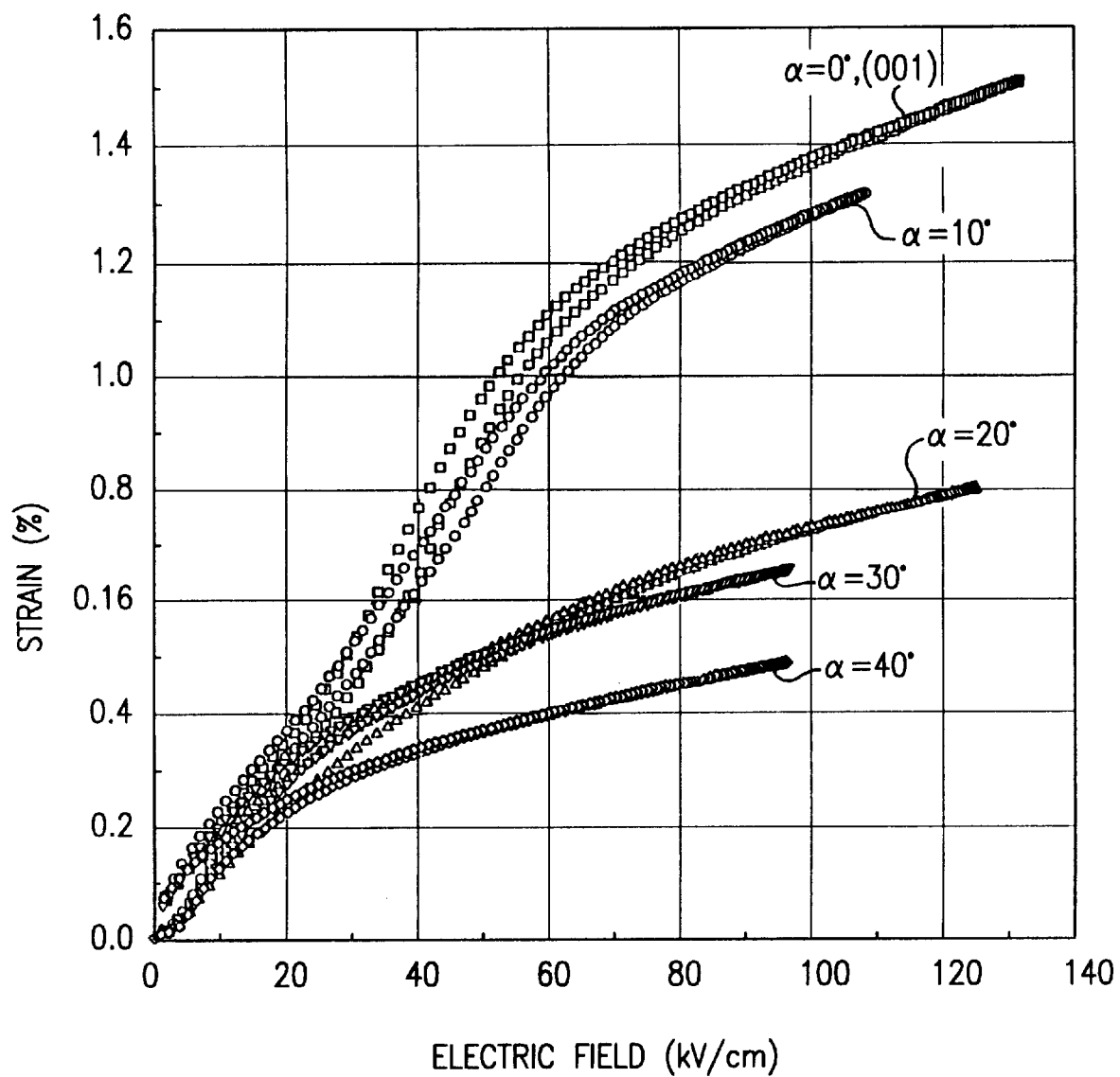
FIG. 22 shows plots of high field (≅100 kV/cm) strain behavior for $Pb(Zn_{1/3}Nb_{2/3})_{0.955}Ti_{0.045}O_3$ crystals oriented along <001>+α direction, where α is the degree of deviation toward <111> from the exact <001> direction, for various values of α.

FIG. 22 shows plots of high field ($\cong$100 kV/cm) strain behavior for $Pb(Zn_{1/3}Nb_{2/3})_{0.955}Ti_{0.045}O_3$ crystals oriented along <001>+α direction, where α is the degree of deviation toward <111> from the exact <001> direction, for various values of α. It is to be noted that when α exceeds 20°, the achievable strain value decreases markedly. Further, increased breakdown strength allowed a <001> crystal to exhibit strain as high as 1.5%.

Figure 23:
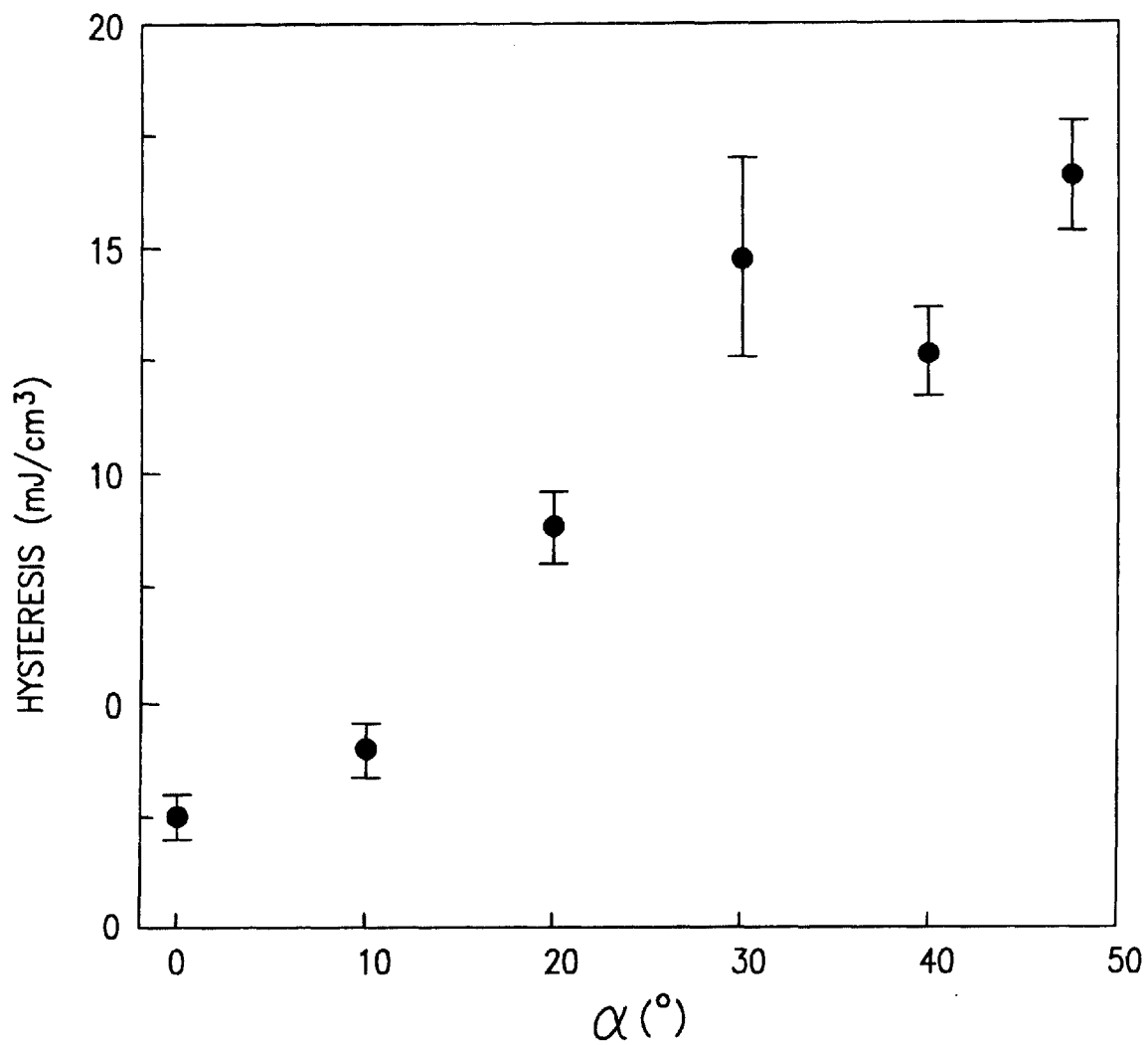
FIG. 23 shows a plot of hysteresis as a function of α for $Pb(Zn_{1/3}Nb_{2/3})_{0.955}Ti_{0.045}O_3$ crystals oriented along <001>+α direction, where α is the degree of deviation toward <111> from the exact <001> direction.

FIG. 23 shows a plot of hysteresis as a function of α for $Pb(Zn_{1/3}Nb_{2/3})_{0.955}Ti_{0.045}O_3$ crystals oriented along <001>+α direction. Hysteresis values were calculated from polarization vs. unipolar electric field when the maximum applied field was 20 kV/cm for all crystals. FIG. 23 indicates that hysteresis caused by domain motion increases with increased value of α, resulting in more heat generation. The increased hysteresis also implies that strain values are not reproducible at the same electric field, a characteristic which is to be avoided for positioner applications.

Figure 24:
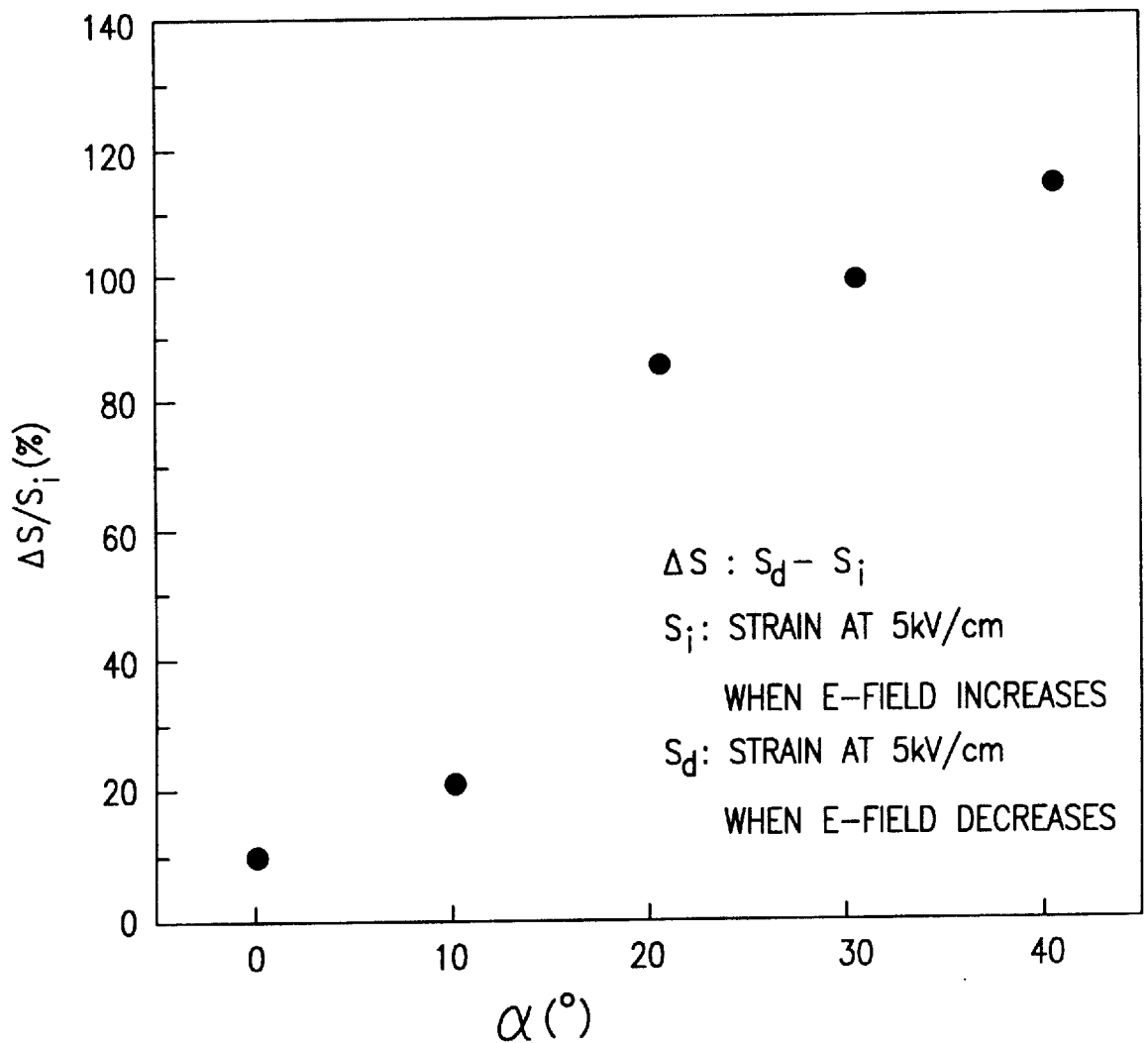
FIG. 24 shows a plot of strain hysteresis as a function of α for $Pb(Zn_{1/3}Nb_{2/3})_{0.955}Ti_{0.045}O_3$ crystals oriented along <001>+α direction, where α is the degree of deviation toward <111> from the exact <001> direction.

FIG. 24 shows a plot relative values of strain hysteresis as a function of α for $Pb(Zn_{1/3}Nb_{2/3})_{0.955}Ti_{0.045}O_3$ crystals oriented along <001>+α direction. Relative values of strain hysteresis were calculated from the equation $(S_d-S_i)/S_i$, where $S_d$ and $S_i$ are strain values at 5 kV/cm with increasing and decreasing the electric field, respectively, and when the maximum applied electric field was 20 kV/cm. Ideally, these values should be zero, resulting in no hysteresis of strain and perfect positional reproducibility. From FIG. 13, it is seen that strain hysteresis increases abruptly at about α=20°.

In summary, single crystals of the preferred ferroelectric compositions were found to have a piezoelectric coefficient ($d_{33}$) as high as 2500 pC/N, maximum electric field induced strains of 1.3% and very low strain-electric field hysteresis. (So long as the applied electric field was applied generally along the <001> crystallographic axis.)

It should be understood that the foregoing description is only illustrative of the invention. Various alternatives and modifications can be devised by those skilled in the art without departing from the invention. For instance, other rhombohedral relaxor-PLbTiO$_3$ crystals will likely exhibit high strain so long as their <001> crystallographic axes are oriented $\cong$20° from a common directional orientation. Also, while the invention has been described in the context of a single crystal actuator configuration, pseudocrystals that consist of multiple single crystals can be utilized so long as their <001> crystallographic axes are oriented $\cong$20° from a common directional orientation. These multiple single crystals can be fabricated using textured growth or epitaxial growth, that is, the growth of crystals of one material on the crystal surface of another material, such that the crystalline substrates of both materials have the same structural orientation. Accordingly, the present invention is intended to embrace all such alternatives, modifications and variances which fall within the scope of the appended claims.

We claim:

1. A transducer comprising single crystals of a lead zinc niobate—lead titanate solid solution and exhibiting at least an 85% longitudinal coupling, wherein said single crystals of lead zinc niobate—lead titanate solid solution have a composition represented by the formulae:

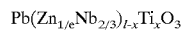

$$Pb(Zn_{1/e}Nb_{2/3})_{1-x}Ti_xO_3$$

where: x is within the following limits: 0.02<x<0.05.

2. The transducer as recited in claim 1, wherein said single crystals are oriented along their respective pseudocubic <001> direction.

3. A transducer comprising single crystals of lead magnesium niobate—lead titanate, wherein said single crystals of lead magnesium niobate—lead titanate solid solution have composition represented by the formulae:

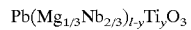

$$Pb(Mg_{1/3}Nb_{2/3})_{1-y}Ti_yO_3$$

where y is within the following limits: 0.20<y<0.50.

4. The transducer as recited in claim 3, wherein y is within the following limits: 0.20<y<0.35.

5. The transducer as recited in claim 3, wherein y is within the following limits: $0.35<y<0.50$.

6. The transducer as recited in claim 3, wherein y is within the following limits: $0.25<y<0.33$.

7. The transducer as recited in claim 3, wherein said single crystals are oriented along their respective pseudocubic <001> direction.

* * * * *

UNITED STATES PATENT AND TRADEMARK OFFICE
CERTIFICATE OF CORRECTION

PATENT NO. : 5,998,910  
APPLICATION NO. : 09/013746  
DATED : December 7, 1999  
INVENTOR(S) : Seung-Eek Park et al.

Page 1 of 1

It is certified that error appears in the above-identified patent and that said Letters Patent is hereby corrected as shown below:

<u>Column 1,</u>
Line 9, after "... 1997." please add the following heading and paragraph from Line 11 and following:

--FEDERALLY SPONSORED RESEARCH AND DEVELOPMENT

This invention was made with government support under Contract No. N00014-93-J-0502, awarded by the Office of Naval Research. The Government has certain rights in the invention.--

Signed and Sealed this

Seventeenth Day of November, 2009

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 5,998,910 |
| APPLICATION NO. | : 09/013746 |
| DATED | : December 7, 1999 |
| INVENTOR(S) | : Seung-Eek Park et al. |

It is certified that error appears in the above-identified patent and that said Letters Patent is hereby corrected as shown below:

In the Description

Column 1,
Line 11: Please correct the following heading and paragraph from
Line 11 and following, as indicated:

--FEDERALLY SPONSORED RESEARCH AND DEVELOPMENT

This invention was made with Government support under Contract No. N00014-93-1-0502, awarded by the Office of Naval Research. The Government has certain rights in the invention.--

Signed and Sealed this

Thirteenth Day of July, 2010

David J. Kappos
*Director of the United States Patent and Trademark Office*